US005538918A

United States Patent [19]
Haase et al.

[11] Patent Number: 5,538,918
[45] Date of Patent: Jul. 23, 1996

[54] METHOD OF FABRICATING A BURIED-RIDGE II-VI LASER DIODE

[75] Inventors: Michael A. Haase; Jun Qiu; Hwa Cheng, all of Woodbury; James M. DePuydt, Stillwater, all of Minn.

[73] Assignee: Minnesota Mining and Manufacturing Company, St. Paul, Minn.

[21] Appl. No.: 363,381

[22] Filed: Dec. 23, 1994

Related U.S. Application Data

[60] Division of Ser. No. 17,115, Feb. 12, 1993, Pat. No. 5,404,027, which is a continuation-in-part of Ser. No. 700,606, May 15, 1991, Pat. No. 5,274,269.

[51] Int. Cl.⁶ .................................................. H01L 21/20
[52] U.S. Cl. ........................................ 437/127; 437/129
[58] Field of Search ................................ 437/127, 129; 148/DIG. 95

[56] References Cited

U.S. PATENT DOCUMENTS

| | | | |
|---|---|---|---|
| 4,534,033 | 8/1985 | Nishizawa et al. | 372/50 |
| 4,575,919 | 3/1986 | Logan et al. | 437/129 |
| 4,607,369 | 8/1986 | Niina et al. | 372/46 |
| 4,727,557 | 2/1988 | Burnham et al. | 372/50 |
| 4,735,662 | 4/1988 | Szabo et al. | 136/256 |
| 4,856,013 | 8/1989 | Iwano et al. | 372/45 |
| 4,868,615 | 9/1989 | Kamata | 357/17 |
| 4,894,833 | 1/1990 | Carlin | 372/44 |
| 4,926,433 | 5/1990 | Imamura et al. | 372/50 |
| 4,957,337 | 9/1990 | Ogawa et al. | 350/96.13 |
| 4,959,106 | 9/1990 | Nakagawa et al. | 136/258 |
| 4,963,507 | 10/1990 | Amann et al. | 437/130 |
| 4,989,214 | 1/1991 | Kwa | 372/50 |
| 4,995,047 | 2/1991 | Hadley et al. | 372/50 |
| 4,995,687 | 2/1991 | Nagai et al. | 350/96.2 |
| 5,008,891 | 4/1991 | Morita | 372/45 |
| 5,032,879 | 7/1991 | Buchmann et al. | 357/19 |
| 5,037,709 | 8/1991 | Tomomura et al. | 428/690 |
| 5,081,632 | 1/1992 | Migita et al. | 372/45 |
| 5,140,149 | 8/1992 | Sakata et al. | 250/211 |
| 5,155,738 | 10/1992 | Ijichi et al. | 372/45 |
| 5,157,467 | 10/1992 | Fujii | 357/16 |
| 5,213,998 | 5/1993 | Qui et al. | 437/129 |
| 5,219,785 | 6/1993 | Welch et al. | 437/129 |
| 5,291,507 | 3/1994 | Haase et al. | 372/44 |
| 5,356,832 | 10/1994 | Mori et al. | 437/129 |
| 5,363,395 | 11/1994 | Gaines et al. | 372/45 |
| 5,395,791 | 3/1995 | Cheng et al. | 437/129 |

FOREIGN PATENT DOCUMENTS

| | | |
|---|---|---|
| 0380106A3 | 8/1990 | European Pat. Off. . |
| 0475606A2 | 3/1992 | European Pat. Off. . |
| 178684(A) | 9/1985 | Japan . |
| 007692 | 1/1988 | Japan . |
| 078279 | 4/1991 | Japan . |
| 2226698 | 7/1990 | United Kingdom . |
| 94015369 | 7/1994 | WIPO .................... 437/129 |

OTHER PUBLICATIONS

"Metalorganic Vapor Phase Epitaxy of Low–Resistivity P–Type ZnSe", Yasuda et al., Appl. Phys. Lett. vol. 52, p. 57–59 (1988).

"P–Type ZnSe by Nitrogen Atom Beam Doping During Molecular Beam Epitaxial Growth", Park et al., Appl. Phys. Lett., vol. 57, pp. 2127–2129 (1990).

"Low–Temperature Growth of ZnSe by Molecular Beam Epitaxy Using Cracked Selenium", Cheng et al., Appl. Phys. Lett., vol. 56, pp. 848–850 (1990).

"Defects in Epitaxial Multilayers", Matthews et al., J. Crystal Growth, vol. 27, pp. 118–125 (1974).

(List continued on next page.)

Primary Examiner—R. Bruce Breneman
Assistant Examiner—Linda J. Fleck
Attorney, Agent, or Firm—Faegre & Benson

[57] ABSTRACT

A buried-ridge or buried-heterostructure II-VI laser diode. Polycrystalline II-VI semiconductor such as ZnS, ZnSSe, ZnSe or CdS deposited by vacuum evaporation buries the etched ridge.

13 Claims, 17 Drawing Sheets

OTHER PUBLICATIONS

"Molecular Beam Epitaxy of CdSe and the Derivative Alloys $Zn_{1-x}Cd_xSe$ and $Cd_{1-x}Mn_xSe$," Samarth et al., J. Electronic Materials, vol. 19, 543–547 (1990).

"Optimum Composition in MBE–$ZnS_xSe_{1-x}$/GaAs for High Quality Hetero–epitaxial Growth", Matsumura et al., J. Crystal Growth, vol. 99, pp. 446–450 (1990).

"Electron Beam Pumped Lasing in ZnSe Grown by Molecular Beam Epitaxy", Potts et al., Appl. Phys. Lett. vol. 50, p. 7 (1987).

"Physics of Semiconductor Devices", Sze, 2nd ed. pp. 681–742 (1981).

Haase et al., "Low–threshold buried–ridge II–VI laser diodes," Applied Physics Letters 63 No. 17, (Oct. 1993) pp. 2315–2317.

"Molecular–Beam Epitaxy Growth of ZnSe Using a Cracked Selenium Source" Cheng et al., J. Voc. Sc. Tech., vol B8., pp. 181–186 (1990).

"Growth of P–and N–Type ZnSe By Molecular Beam Epitaxy", Cheng et al., J. Crystal Growth, vol. 95, pp. 512–516 (1989).

"Laser Action in the blue–green from optically pumped (Zn,Cd)Se/ZnSe single quantum well structures", Ding et al., Appl. Phys. Lett., vol. 57, pp. 2756–2758 (1990).

"Electron Beam Pumped II–VI Lasers", Colak et al., J. Crystal Growth, vol. 72, pp. 504–511 (1985).

"Short Wavelength II–VI Laser Diodes", Haase et al., Inst. Phys. Conf. Ser. No. 120: Chapter 1 (1992).

"Optically Pumped Blue–Green Laser Operation Above Room–Temperature in $Zn_{0.80}Cd_{0.20}Se$–$ZnS_{0.08}Se_{0.92}$ Multiple Quantum Well Structures Grown by Metalorganic Molecular Beam Epitaxy", Kawakami et al., Japanese Journal of Applied Physics, vol. 30, pp. L–605–607.

"Pseudomorphic $In_yGa_{1-y}As$/GaAs/$Al_xGa_{1-x}As$ Single Quantum Well Surface–Emitting Lasers With Integrated 45° Beam Deflectors", Kim et al., Appl. Phys. Lett., vol. 58, pp. 7–9.

"Blue–Green Laser Diodes", Haase et al., Appl. Phys. Lett. vol. 59, pp. 1272–1274.

Toshihisa Tsukada, GaAs–$Ga_{1-x}Al_1As$ buried–heterostructure injection lasers, J. Appl. Physics, vol. 45 pp. 4899–4906 (Nov. 1974).

Salokave et al., "Continuous–wave, room temperature, ridge waveguide green–blue diode laser", Electronics Letters, 9 Dec. 1993, vol. 29 No. 25, pp. 2192–2194.

METHOD OF FABRICATING A BURIED-RIDGE II-VI LASER DIODE

This is a division of U.S. patent application Ser. No. 08/017,115, filed Feb. 12, 1993, and entitled "Buried-Ridge II-VI Laser Diode", which is a continuation-in-part of U.S. application Ser. No. 07/700,606, filed May 15, 1991, entitled "Ohmic Contact For P-type Group II-VI Compound Semiconductors", now U.S. Pat. No. 5,274,269.

BACKGROUND OF THE INVENTION

The present invention relates generally to semiconductor laser diodes. In particular, the present invention is a II-VI laser diode having a buried-ridge waveguide, and a method for fabricating the device.

Laser diodes-fabricated from II-VI semiconductor materials have been demonstrated by researchers at 3M in St. Paul, Minn. These devices emit radiation at about 520 nm at room temperature, a wavelength in the blue-green portion of the spectrum. They are disclosed generally in the Haase et al. article *Short Wavelength II-VI Laser Diodes*, Conference Proceedings for Gallium Arsenide and Related Compounds, 1991 Institute of Physics Conference Series, No. 120, pp.9–16.

Buried-ridge (buried-heterostructure) laser diodes fabricated from III-V compound semiconductors such as GaAs and AlGaAs and emitting infrared light are well known and widely used. One of the first demonstrations of a buried-ridge III-V laser diode was reported by Tsukada in GaAs-$Ga_{1-x}Al_xAs$ Buried-Heterostructure Injection Lasers. *J. Appl. Physics*, Vol. 45, p. 4899 (November 1974). These devices are fabricated using an epitaxial "regrowth" procedure by which the initial epitaxial structure is etched and then returned to a crystal growth apparatus to grow the lateral confinement layers (cladding). Epitaxial regrowth typically involves high substrate temperatures to desorb the oxides that form on the device when it is exposed to air after the etching step which forms the ridge.

The Iwano et al. U.S. Pat. No. 4,856,013 discloses a laser diode having an active layer and contact layer formed of III-V semiconductor compounds. The III-V semiconductor is etched to form a rib, and the rib buried in a confinement layer of II-VI semiconductor formed by metal organic chemical vapor deposition (MOCVD). The Niina et al. U.S. Pat. No. 4,607,369 discloses a semiconductor laser buried in a II-VI compound formed by a low temperature deposition process such as MOCVD. However, these epitaxial regrowth techniques are not feasible with II-VI devices since the desorption temperatures required would destroy the conductivity of the previously grown layers.

It is evident that there remains a continuing need for improved II-VI laser diode technology. For widespread commercial viability, the laser diodes must be relatively simple in construction and inexpensive to manufacture. The devices must also be capable of operating at relatively low threshold currents, and providing output beams of good optical quality.

SUMMARY OF THE INVENTION

The present invention is a buried-ridge (buried heterostructure) II-VI laser diode of relatively simple construction that can be efficiently manufactured. In one embodiment the burying layer is deposited by relatively low temperature techniques which will not destroy the conductivity of the p-type layers. Prototypes have exhibited single lateral mode operation at relatively low threshold currents.

The laser diode of the present invention includes a single crystal semiconductor substrate of a first conductivity type, and adjacent first and second guiding layers of II-VI semiconductor on the substrate. The first and second guiding layers are of first and second conductivity types, respectively, and form a pn junction. A quantum well active layer of II-VI semiconductor is located adjacent the pn junction. A buried-ridge waveguide for lateral optical and current confinement is formed by a ridge in at least one of the layers of II-VI semiconductor, and a burying layer of II-VI semiconductor on opposite sides of the ridge. Electrical power is coupled to the laser diode by first and second electrodes.

In one embodiment the burying layer is a layer of polycrystalline II-VI semiconductor. This burying layer can be deposited by vacuum evaporation.

Another embodiment of the laser diode also includes a first cladding layer of II-VI semiconductor of a first conductivity type between the substrate and the first guiding layer, and a second cladding layer of II-VI semiconductor of a second conductivity type between the second guiding layer and the second electrode. The ridge extends at least into the second cladding layer in this embodiment.

Yet another embodiment includes a GaAs substrate, ZnSSe cladding layers and ZnSe guiding layers. The quantum well layer is CdZnSe. Polycrystalline ZnSe or ZnS can be used as the burying layer for the buried-ridge waveguide.

DETAILED DESCRIPTION OF THE PREFERRED EMBODIMENTS

Figure 1:
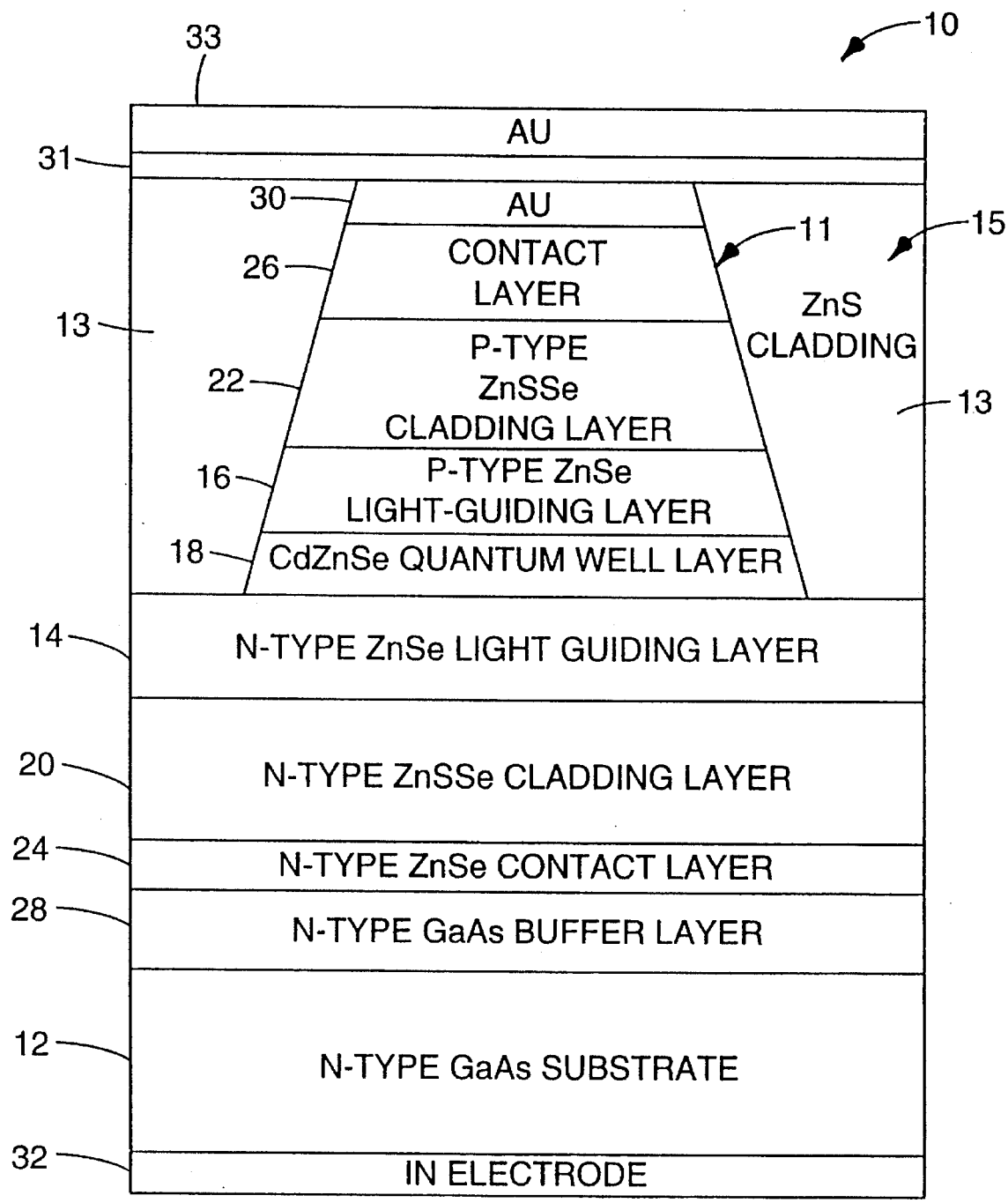
FIG. 1 is a cross-sectional view (not to scale) illustrating the structure of a first embodiment of a II-VI semiconductor laser diode in accordance with the present invention.

A buried-ridge (buried-heterostructure) II-VI compound semiconductor laser diode 10 in accordance with the present invention is illustrated generally in FIG. 1. As shown, laser diode 10 includes a 1–10 μm wide ridge 11 having sides surrounded or "buried" by polycrystalline ZnS burying layer 13 to form a buried-ridge waveguide 15. This index guided device supports single lateral mode operation at relatively low threshold currents. Prototypes described below have exhibited laser action, emitting coherent blue-green light with threshold currents as low as 4 mA (pulsed) at 85K, and as low as 66 mA at room temperature.

Laser diode 10 is fabricated on a GaAs substrate 12, and includes a pn junction formed by lower (first) and upper (second) ZnSe light-guiding layers 14 and 16, respectively. A CdZnSe quantum well active layer 18 is positioned between guiding layers 14 and 16 in the embodiment shown. However, active layer 18 can be positioned at other locations within layers 14 and 16 and adjacent the pn junction. The surfaces of light-guiding layers 14 and 16 opposite active layer 18 are bounded by lower and upper ZnSSe cladding layers 20 and 22, respectively. A lower ZnSe ohmic contact layer 24 is positioned on the surface of lower cladding layer 20 opposite light-guiding layer 14, while an upper ZnSe ohmic contact layer 26 is positioned on the surface of upper cladding layer 22 opposite light-guiding layer 16. Although it is not always incorporated into the device, the illustrated embodiment includes a GaAs buffer layer 28 which separates substrate 12 from lower ZnSe contact layer 24 to assure high crystalline quality of the contact and subsequently deposited layers. Electrical contact to the ohmic contact layer 26 is made by Au layer 30. A thin Ti layer 31 and subsequently a final Au layer 33 are applied over burying layer 13 and exposed portions of Au layer 30 to form an upper electrode. Electrical contact to the lower side of laser diode 10 is made by an In or Pd-Au electrode 32 on the surface of substrate 12 opposite the lower ohmic contact layer 24.

Layers 24, 20 and 14 are all doped n-type with Cl (i.e., are of a first conductivity type) in prototypes of laser diode 10. Layers 16, 22 and 26 are all doped p-type with N (i.e., are of a second conductivity type). Active layer 18 can be a short-period strained-layer superlattice (SPSLS) quantum well. Light-guiding layers 14 and 16 are both 0.5 μm thick. Lower light-guiding layer 14 is doped to a net donor concentration of $1\times10^{17} cm^{-3}$, while upper light-guiding layer 16 is doped to a net acceptor concentration of $2\times10^{17} cm^{-3}$. Cladding layers 20 and 22 are layers of $ZnS_{0.007}Se_{0.93}$ semiconductor deposited to thicknesses of 1.5 μm and 1 μm, respectively. The net donor concentration of the lower cladding layer is $1\times10^{17} cm^{-3}$. The net acceptor concentration of the upper cladding layer is $2\times10^{17} cm^{-3}$. Ohmic contact layer 24 is deposited to a thickness of 0.02 μm in these prototype devices. Ohmic contact layer 26 is deposited to a thickness of 0.1 μm. The lower contact layer is doped n-type to a net donor concentration of $7\times10^{18} cm^{-3}$. The upper contact layer is doped p-type to a net acceptor concentration of $2\times10 cm^{-3}$.

Other parameters and materials can also be used in the fabrication of laser diodes 10 in accordance with the present invention. For example, the thicknesses of layers 24, 20, 14, 16, 22 and 26 can be varied as needed for given applications. Typical thickness ranges for contact, cladding and light-guiding layers 24, 20 and 14 are 0.01 to 1.0 μm, 0.5 to 5.0 μm, and 0.1 to 1.0 μm, respectively. In general, the thicknesses of light-guiding layers 14 and 16 should be chosen to minimize the width of the optical mode. If the layers 14 and 16 are too thin, the evanescent tails will extend far into cladding layers 20 and 22. Cladding layers 20 and 22 should be thick enough to make absorption of the optical mode in substrate 12 and electrode 32 negligible. Quantum well active layer 18 can also be grown as a $Cd_xZn_{1-x}Se$ layer by conventional molecular beam epitaxy (MBE) techniques with x (which determines the laser wavelength) of approximately 0.3 to provide a large enough band gap difference ($\Delta E_g$ of approximately 0.3 eV) to facilitate effective carrier confinement.

The composition of the $ZnS_ySe_{1-y}$ cladding layers 20 and 22, with y of approximately 0.07, was selected to provide sufficient difference in refractive index from the index of the ZnSe guiding layers 14 and 16 to form a low-loss waveguide. This composition also provides excellent morphology since it is nearly lattice matched to the GaAs substrate at the growth temperature of 300° C. Cladding layers 20 and 22 can also be fabricated from other II-VI semiconductors such as MnZnSSe, MgZnSSe and CdZnS.

Waveguide burying layer 13 can also be fabricated from other II-VI semiconductors such as ZnSe, ZnSSe, CdS, ZnTe, CdTe, CdZnS or other semiconductor compounds or alloys. In addition to having an index of refraction which enables the low-loss index-guided function of waveguide 15, the material selected for burying layer 13 should be of high electrical resistivity and suitable for the efficient fabrication of laser diode 10.

Other n-type dopants which may be used include Ga, Al, In, I, F, and Br. Oxygen or Li acceptors can also be used for the p-type dopants. Other Group V p-type dopants which might be used include arsenic and phosphorous. Greater or lesser donor and acceptor concentrations can also be used, although they should not be so high as to cause excessive free-carrier absorption, nor so low as to cause excessive resistance.

The prototypes of laser diode 10 are fabricated on Si-doped $n^+$-type GaAs substrate 12 having a (100) crystal orientation. Substrates 12 of this type are commercially available from a number of manufacturers including Sumitomo Electric Industries, Ltd. GaAs buffer layer 28 is deposited to a thickness of 1 μm in this embodiment, and doped n+ with Si to a net donor concentration of $1\times10^{18} Scm^{-3}$. Other appropriate substrates (e.g., ZnSe, GaInAs InGaP, GaP or Ge) and buffer layers such as AlGaAs, AlAs, GaInP, AiInP, AlInAs, GaP or GaInAs can also be used. The thickness of buffer layer 28 can also be varied while providing an appropriate high-quality surface for growing the II-VI semiconductors. If an appropriate high-quality substrate and appropriate surface preparation are used, buffer layer 28 may not be needed.

The lattice constants of the ZnSSe cladding layers 20 and 22 and the adjacent ZnSe layers 24, 14 and 16, 26, respectively, are mismatched by about 0.3%. Preliminary transmission electron microscopy (TEM) studies indicate that the ZnSe of light-guiding layers 14 and 16 is at least partially relaxed by dislocations formed at the interfaces of the light-guiding layers and the adjacent ZnSSe cladding layers 20 and 22, respectively. Another embodiment (not shown) that is fully lattice matched includes ZnSSe guiding layers with either CdMnZnS, CdMgZnS, CdMnZnS, CdMgZnS, CdZnS or MgZnSSe cladding layers 20 and 22. Furthermore, if light-guiding layers 14 and 16 are sufficiently thin, the light-guiding layers need not necessarily be doped (i.e., can be undoped or at least not purposely doped).

Figure 2:
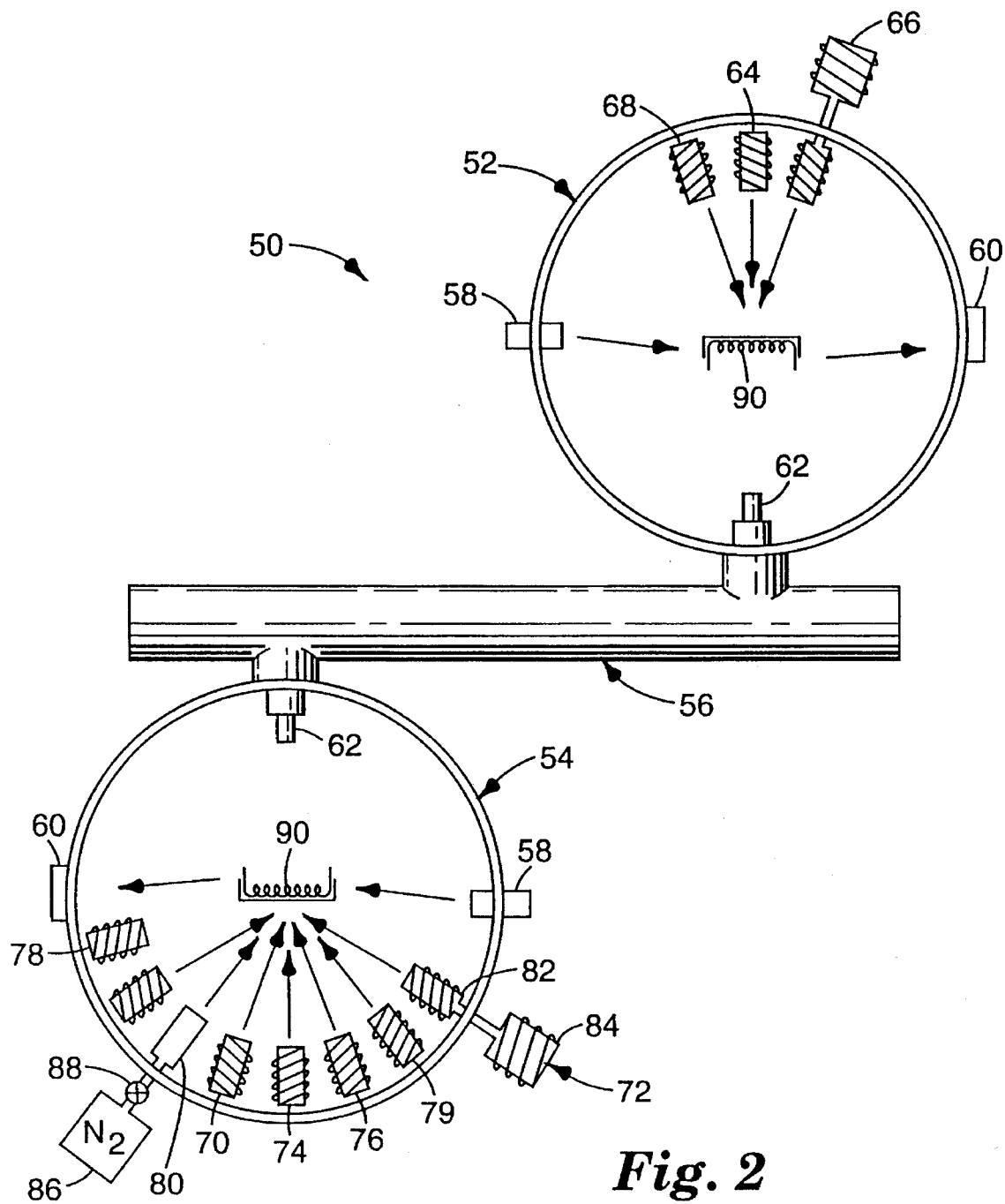
FIG. 2 is an illustration of a molecular beam epitaxy (MBE) system that can be used to fabricate laser diodes in accordance with the present invention.

FIG. 2 is an illustration of a molecular beam epitaxy (MBE, system 50 used to fabricate the laser diode 10 described above. MBE system 50 includes two MBE chambers 52 and 54 interconnected by ultrahigh vacuum (UHV) pipeline 56. Each chamber 52 and 54 includes a high energy electron gun 58, a phosphorus screen 60, a substrate heater 90 and a flux monitor 62. MBE chambers such as 52 and 54 are generally known and commercially available. A Perkin-Elmer Model 430 MBE system was used to produce the prototype laser diodes 10.

MBE chamber 52 is used to grow the GaAs buffer layer 28 on substrate 12 and includes a Ga effusion cell 64 and an As cracking cell 66. A Si effusion cell 68 is also provided as a source of n-type dopants. Substrate 12 is cleaned and prepared using conventional or otherwise known techniques, and mounted to a Molybdenum sample block (not shown in FIG. 2) by In solder before being positioned within chamber 52. By way of example, substrate preparation techniques described in the Cheng et al. article *Molecular-Beam Epitaxy Growth Of ZnSe Using A Cracked Selenium Source*, J. Vac. Sci. Technol., B8, 181 (1990) were used to produce the prototype laser diode 10. The Si doped buffer layer 28 can be grown on substrate 12 by operating MBE chamber 52 in a conventional manner, such as that described in *Technology and Physics of Molecular Beam Epitaxy*, ed. E. N. C. Parker, Plenum Press, 1985. The resulting buffer layer 28 has an As-rich surface which exhibited a c(4×4) reconstruction as observed by reflection high energy electron diffraction (RHEED). The sample block bearing the GaAs substrate 12 and buffer layer 28 is then transferred to MBE chamber 54 through UHV pipeline 56 for further processing.

Device layers 24, 20, 14, 18, 16, 22, and 26 are all grown on the buffer layer 28 and GaAs substrate 12 within MBE chamber 54. To this end, chamber 54 includes a Zn effusion cell 70, cracked-Se effusion cell 72, ZnS effusion cell 74 (as a source of S), Cd effusion cell 76 and a conventional Se (i.e., primarily $Se_6$) effusion cell 79. As shown, cracked-Se effusion cell 72 includes a bulk evaporator 84 and high temperature cracking zone 82, and provides a source of cracked Se (including $Se_2$ and other Se molecules with less than 6 atoms). The bulk evaporator 84 and high temperature cracking zone 82 used to produce the prototype laser diodes 10 are of a custom design, the details and capabilities of which are described in the Cheng et al. J. Vac. Sci. Technol. article referenced above. Cl effusion cell 78 which utilizes $ZnCl_2$ source material provides the Cl n-type dopant. The p-type dopant is provided by N free-radical source 80. Free-radical source 80 is connected to a source 86 of ultra-pure $N_2$ through leak-valve 88. The free-radical source 80 used in the fabrication of laser diodes 10 is commercially available from Oxford Applied Research Ltd. of Oxfordshire, England (Model No. MPD21). This source has a length of 390 mm. The beamexit plate at the end of the source is made of pyrolytic boron nitride (PBN) and has nine 0.2 mm diameter holes through it. This source is mounted on a standard port for an effusion cell through a 10 inch (25.4 cm) extension tube. $N_2$ source 86 used to fabricate laser diodes 10 inch (25.4 cm) is of research purity grade, produced by Matheson Gas Products.

MBE chamber 54 is operated in a manner described in the Cheng et al. article *Growth Of p- and n- Type ZnSe By Molecular Beam Epitaxy*, J. Crystal Growth 95, 512 (1989) using the $Se_6$ source 79 as the source of Se to grow the n-type contact, cladding and light-guiding layers 24, 20 and 14, respectively, of the prototype laser diode 10. Layer 24 is grown before increasing the ZnS oven temperature to the ZnSSe growth conditions. In this way, the S background pressure is kept low, thereby minimizing S reactions with the GaAs substrate. Lower ZnSSe cladding layer 20 is doped n-type using the $ZnCl_2$ source. Other aspects of the techniques used to grow cladding layers 20 and 22 are described in the Matsumura et al. article, *Optimum Composition In MBE-$ZnS_xSe_{1-x}$/ZnSe For High Quality Heteroepitaxial Growth*, J. Crys. Growth, vol. 99, p. 446 (1990).

Figure 3:
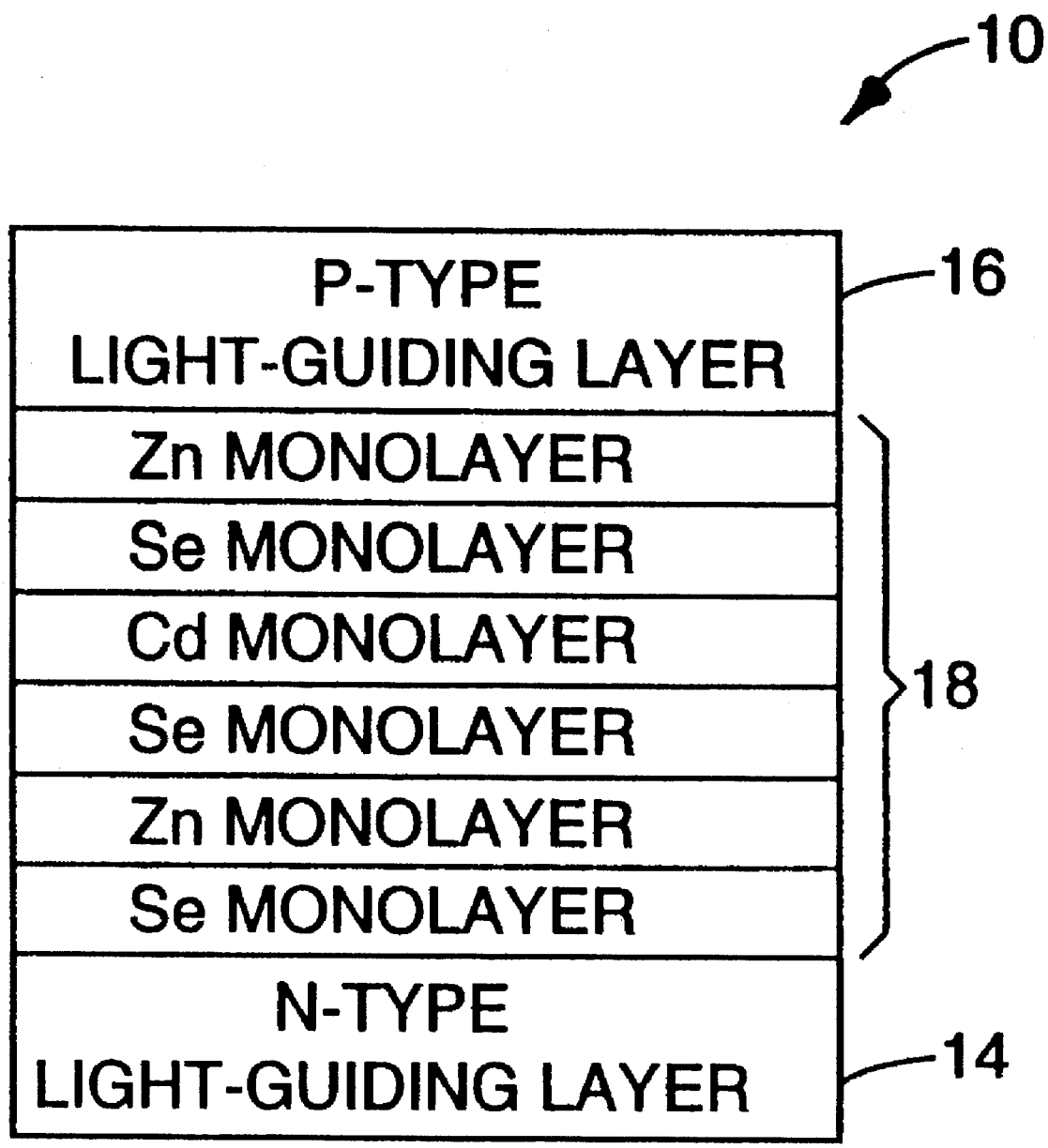
FIG. 3 is a detailed cross sectional view of the quantum well layer shown in FIG. 1.

SPSLS quantum well layer 18 is grown on the light-guiding layer 14 of laser diode 10 using atomic layer epitaxy (ALE) and/or migration enhanced epitaxy (MEE). Using these techniques, which are generally known, quantum well layer 18 is formed as a series of overlaying layers, nominally one atom thick, typically, (i.e., monolayers) of Cd, Zn and Se. A detailed illustration of quantum well layer 18 is shown in FIG. 3. In this embodiment, quantum well layer 18 includes adjacent monolayers of Cd and Se between a pair of adjacent monolayers of Zn and Se. This structure can be described generally by the following notation:

$$[(CdSe)_m(ZnSe)_n]_p$$

where: m, n and p are integers.

In the embodiment illustrated in FIG. 3, m=1, n=2, and p=1. In other embodiments (not shown) m=1, n=2 and p=3–4. The equivalent Cd concentration in quantum well layer 18 is determined by the ratio of the number of CdSe layers to the total number of layers (including both ZnSe and CdSe) in the quantum well layer. Total thickness of quantum well layer 18 is given by the number of monolayers grown times the thickness of each monolayer.

Figure 4:
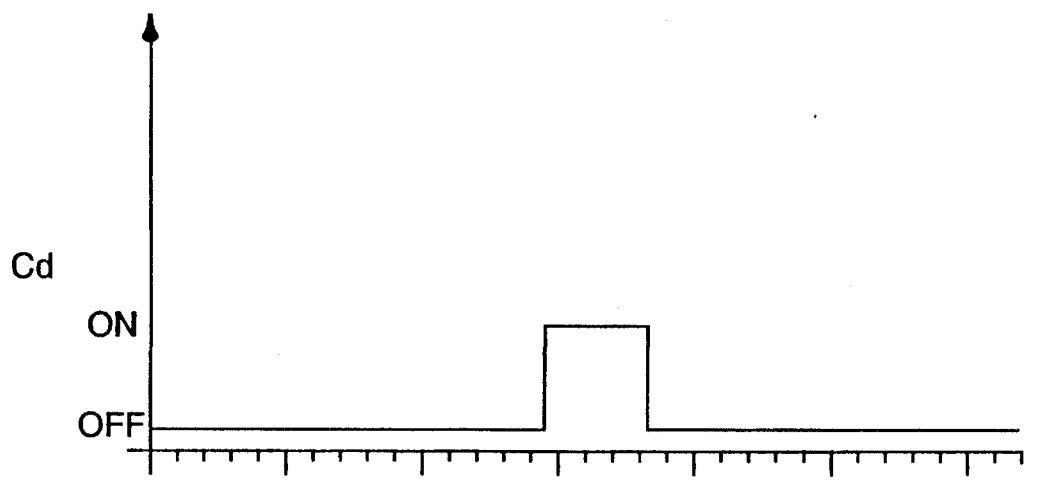
FIGS. 4, 4A and 4B are graphs of the shutter sequence by which the MBE system shown in FIG. 2 is operated to fabricate the quantum well layer of laser diodes in accordance with the present invention.
Figure 4A:
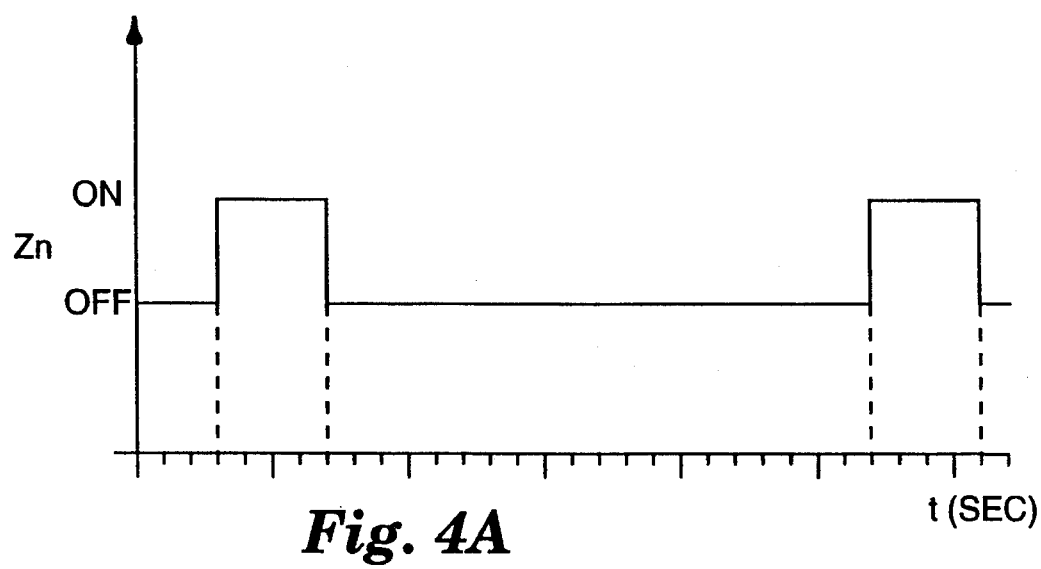
Figure 4B:
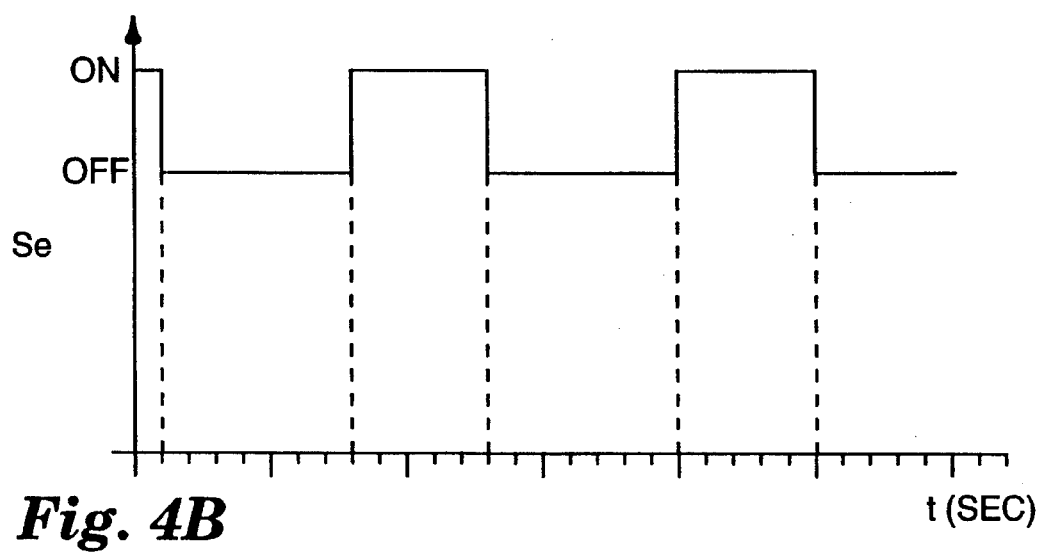

Control over the composition and thickness of the Cd, Zn and Se monolayers of quantum well layer 18 are accurately achieved by ALE and/or MEE. Through use of these techniques, monolayer growth is controlled primarily by the sequence and timing by which the shutters (not separately shown) of the Cd, Zn and Se effusion cells 76, 70, and 72, respectively, are opened and closed. A portion of the effusion cell shutter sequence used to grow the quantum well layer 18 illustrated in FIG. 3 is shown in FIGS. 4, 4A and 4B. A characteristic delay time is introduced between the sequential pulses of the reactant species to allow for the reevaporation of excess reactant.

Prototype laser diodes 10 include SPSLS quantum well layers such as that shown in FIG. 3 that have been grown at temperatures of 150° C. and using the thermally cracked Se ($Se_2$) effusion cell 72. The shutter sequence begins with the Se shutter open. The Se shutter is closed after depositing at least one monolayer (about 5 seconds). The Zn shutter is then immediately opened. Next, the Zn shutter is closed after depositing at least one monolayer of Zn (about 4 seconds). A slight delay (about 1 second) is included between the closing of the Zn shutter and the reopening of the Se shutter to allow time for the evaporation of any excess Zn. Growth continues by alternately opening and closing the shutters to sequentially deposit overlaying layers of Cd, Se and Zn, The Cd shutter is opened for about 4 seconds, followed by a delay of about 1 second before the Se shutter is reopened. The sequence beginning with the open Se shutter is then repeated to complete quantum well layer 18. Improved performance has been observed when at least two monolayers of ZnSe are grown at 150° C. by ALE before and after the growth of the CdZnSe SPSLS quantum well. Other operating parameters of MBE chamber 54 used to produce the quantum well layer 18 of the prototype laser diodes 10 are as follows:

Cd beam equivalent pressure: $2.0 \times 10^{-7}$ Torr *
Zn beam equivalent pressure: $1.0 \times 10^{-7}$ Torr *
Se cracking zone temperature: 600° C. *
Se bulk evaporator temperature: 250° C. *
* parameters dependant upon specific MBE system configuration.

Prototype laser diodes 10 having SPSLS quantum well layers 18 grown in the manner describe above at 150° C. have exhibited the highest quantum efficiency. However, quantum well test wafers with SPSLS quantum well layers grown at temperatures up to 235° C. have exhibited good characteristics. Acceptable characteristics have been observed in test wafers with SPSLS quantum well layers grown at temperatures as high as 300° C. It is also anticipated that devices having desirable characteristics can be grown at temperatures less than 150° C.

In other embodiments, quantum well active layer 18 can be grown to a thickness less than the critical thickness in a manner described in the Samarth et al. article, *Molecular Beam Epitaxy of CdSe and the Derivative Alloys $Zn_{1-x}Cd_xSe$ and $Cd_{1-x}Mn_xSe$*, J. Electronic Materials, vol. 19. No. 6, p. 543 (1990). Quantum well layers 18 of this type will be pseudomorphic, minimizing dislocations in the light-emitting region of laser diode 10. The maximum pseudomorphic thicknesses for strained epitaxial layers of this type depends on the composition and can be calculated from formulae described in Matthews et al., *Defects In Epitaxial Multilayers*, J. Crystal Growth, vol. 27, p. 118 (1974). The inclusion of such a pseudomorphic quantum well layer 18, which could also be a pseudomorphic layer of other semiconductor material such as ZnSeTe or CdZnSeTe, facilitates the low threshold current operation of laser diode 10 when positioned within the thicker, low-loss II-VI waveguide. The waveguide can be made with higher refractive index light-guiding layers 14 and 16 and lower refractive index cladding layers 20 and 22 which can have a relatively small difference in their band gaps and which can be, but need not be, lattice-matched. The composition of the light-guiding layers may be graded to minimize dislocations and/or to form a graded index waveguide.

MBE chamber 54 is operated in a manner described in the Park et al. European Patent Publication No. 0475 606 A3, published Mar. 18, 1992, and entitled Doping Of IIB-VIA Semiconductors During Molecular Beam Epitaxy using the $Se_6$ source 79 to grow the p-type light-guiding layer 16 and cladding layer 22. This Park et al. EPO application is hereby incorporated by reference.

A low resistivity p-type ZnSe ohmic contact layer 26 has been achieved by growing the contact layer at low temperature within MBE chamber 54 utilizing the cracked Se source 72 (i.e., cracking zone 82 and evaporator 84), while at the same time doping the semiconductor material of the contact layer p-type in the manner described in the Park et al. EPO application referred to immediately above. The low temperature growth technique used to produce the contact layer 26 of the prototype laser diode 10 is described generally in the Cheng et al. article *Low Temperature Growth Of ZnSe By Molecular Beam Epitaxy Using Cracked Selenium*, Appl. Phys. Lett. (Feb. 1990). The semiconductor wafer with layers 28, 24, 20, 14, 18, 16 and 22 on substrate 12 is heated to a temperature less than 250° C. but high enough to promote crystalline growth of the ZnSe doped with the N p-type dopants to a net acceptor concentration of at least $1 \times 10^{17} cm^{-3}$. A net acceptor concentration of $1 \times 10^{18} cm^{-3}$ was achieved in the ohmic contact layer 26 of prototype laser diodes 10, when grown at a substrate temperature of about 150° C. Ohmic contact layers 26 with acceptable characteristics can be achieved at other growth temperatures down to 130° C. or less. Other operating parameters of MBE chamber 54 used to produce the ohmic contact layer 26 of the prototype laser diodes 10 are as follows:

Zn beam equivalent pressure: $1.0 \times 10^{-7}$ Torr*
Se cracking zone temperature: 600° C.*
Se bulk evaporator temperature: 250° C.*
Growth rate: 0.3–0.6 µm/hr
Surface reconstruction: Zn-stabilized
Nitrogen pressure in chamber: $>3.5 \times 10^{-7}$ Torr*
rf power: 90–250 W*
* parameters dependant upon specific MBE system configuration Following the deposition of contact layer 26, the as yet incomplete laser diode 10 is removed from MBE chamber 54 and transferred to a conventional vacuum evaporator (not shown). In the vacuum evaporator a 1000 Å Au layer 30 is vacuum evaporated onto contact layer 26 to provide electrical contact. A thin (100 Å) Ti layer (not shown) is subsequently evaporated onto the Au layer 30 to improve photoresist adhesion during the ridge fabrication steps described below.

Figure 5A:
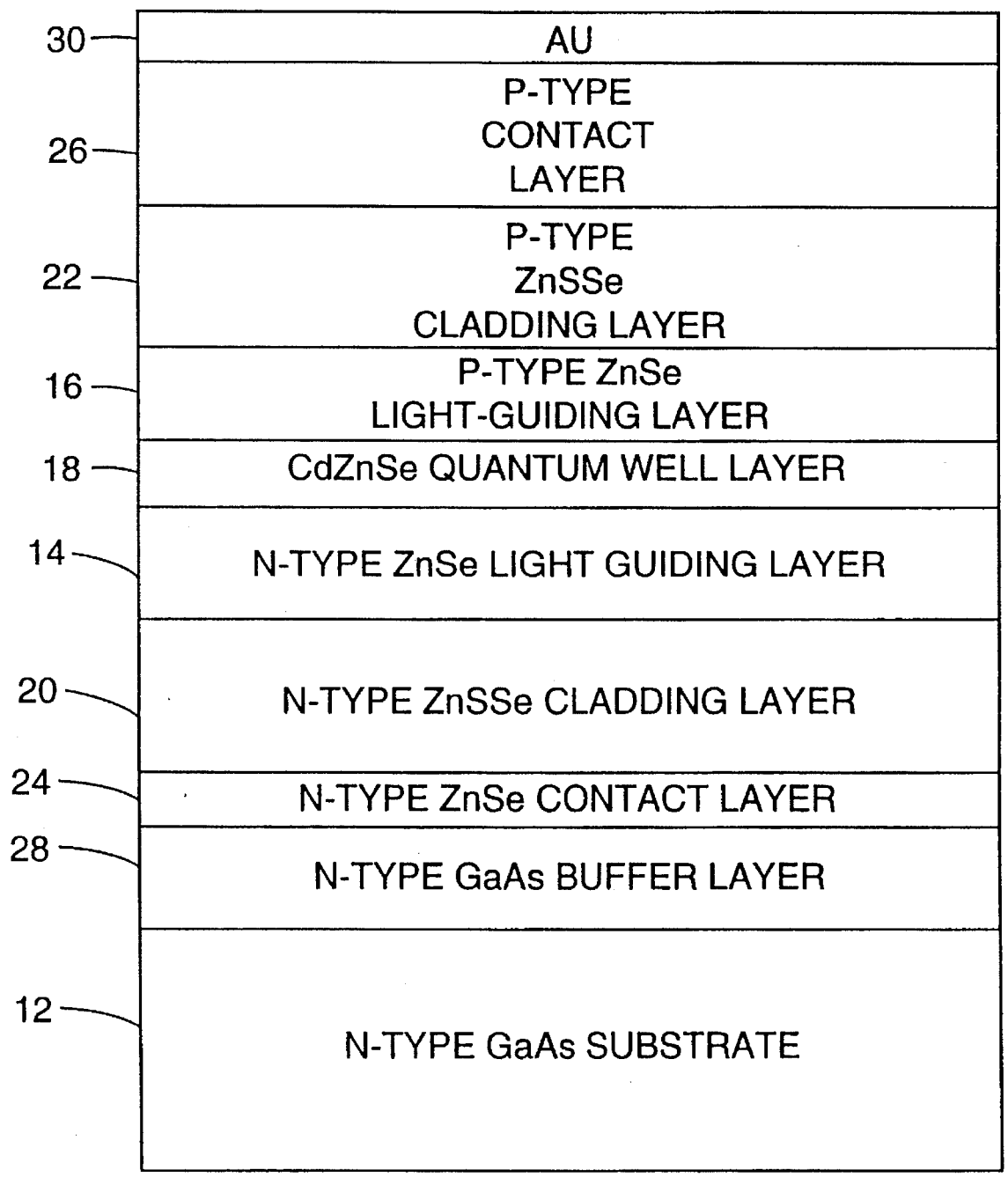
FIGS. 5A–5I are cross-sectional views (not to scale) of a wafer at various stages during the fabrication of laser diodes in accordance with the present invention.

FIG. 5A is an illustration of the semiconductor wafer of the as yet incomplete laser diode 10 after the fabrication steps described above have been performed. Waveguide 15 is fabricated on the wafer shown in FIG. 5A in the following manner.

Figure 5B:
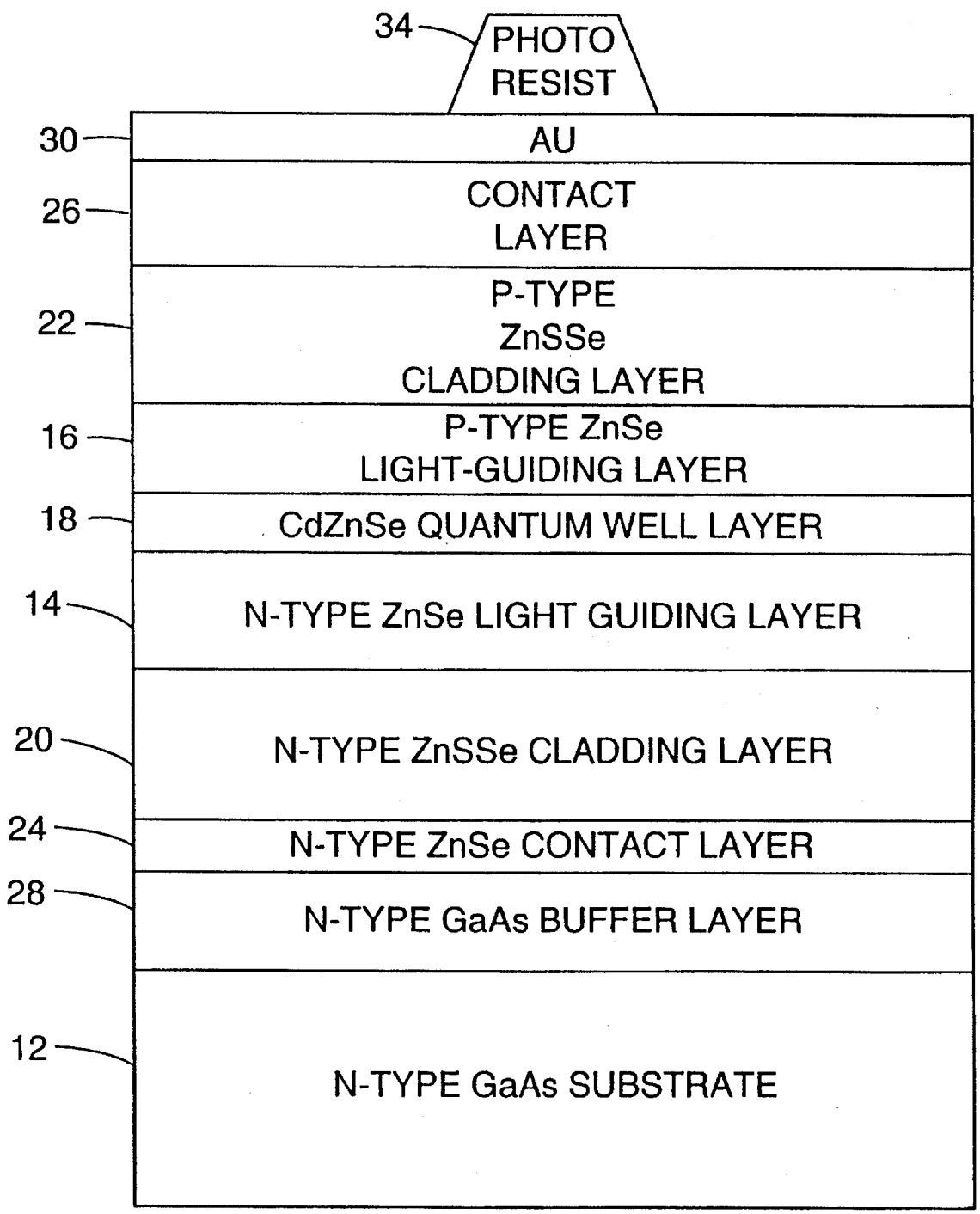

The fabrication of waveguide 15 from the wafer shown in FIG. 5A begins with the application of a patterned photoresist mask stripe 34 such as that illustrated in FIG. 5B. Stripe 34 is applied to a width of 2–10 µm, corresponding to the desired width of the ridge to be formed. In one embodiment, Hoechts Celanese photoresist and associated process AZ-1518-SFD are used to create mask 34. This process provides the positive sidewall angles illustrated in FIG. 5B.

Figure 5C:
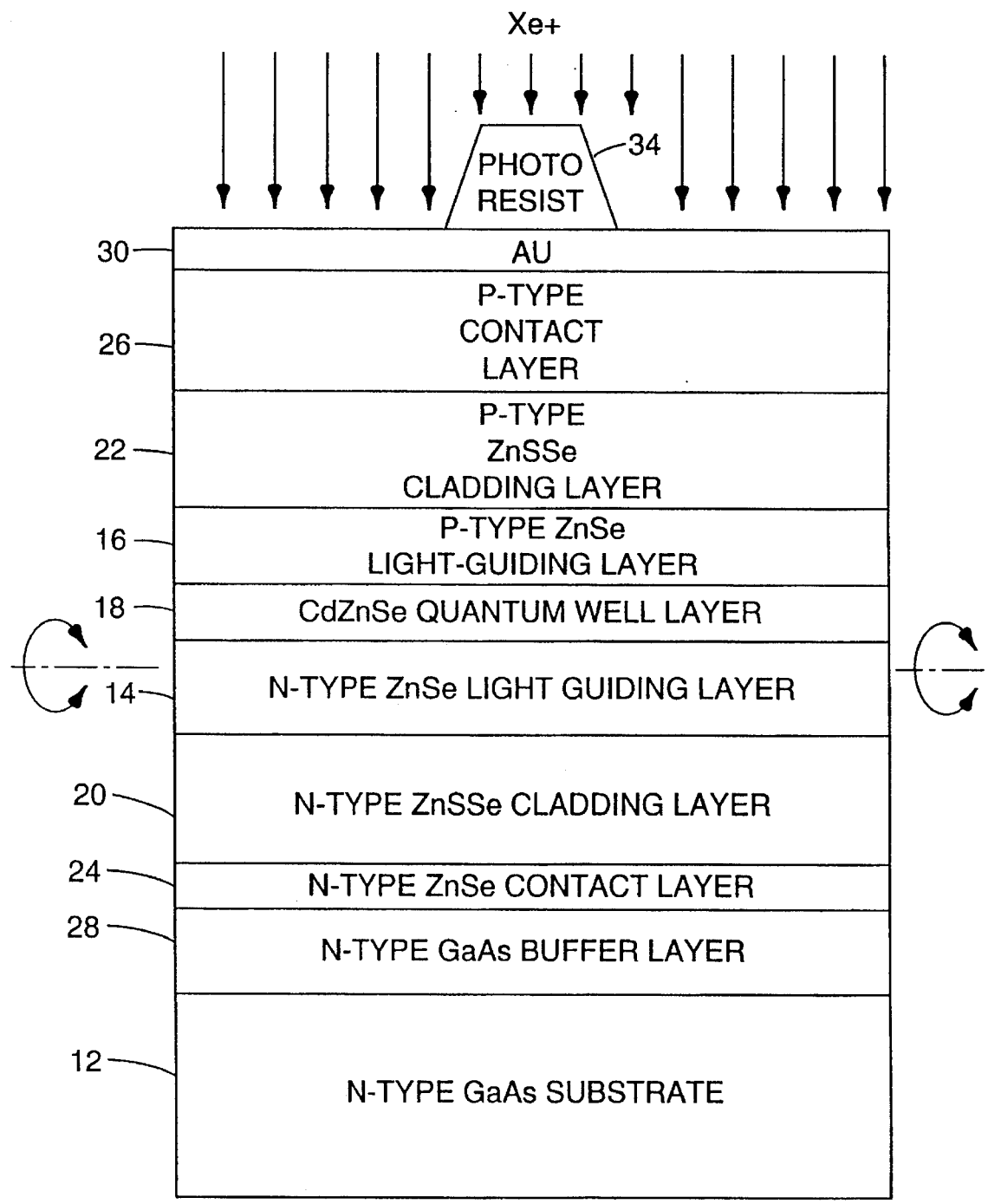
Figure 6:
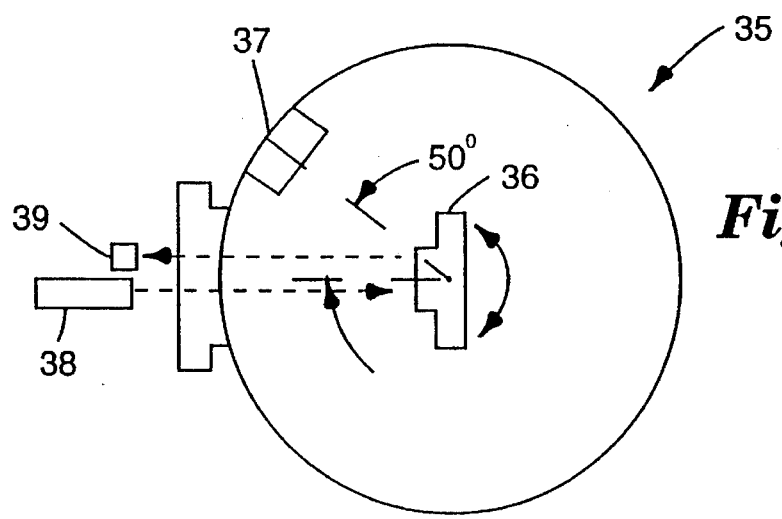
FIG. 6 is an illustration of a vacuum chamber used to fabricate laser diodes in accordance with the present invention.

The wafer illustrated in FIG. 5B is transferred to another vacuum chamber, such as that shown at 35 in FIG. 6, where an ion milling etching process is implemented to form ridge 11 from the wafer. Vacuum chamber 35 includes a rocking mount 36 and an ion source 37. In one preferred embodiment, ion source 37 is a $Xe^+$ source. An $Ar^+$ ion source 37 can also be used effectively. The beam from a He-Ne laser 38 is directed through a window in chamber 35 and impinged on the wafer during the etching process. Portions of the laser beam reflected from the wafer are detected by detector 39 and monitored to determine the etch depth. The ion milling process is illustrated graphically in FIG. 5C. Ion source 37 was driven with a beam voltage of about 1000 volts to produce prototypes of laser diode 10. As depicted in FIG. 5C, mount 36 is also reciprocally rotated to rock the wafer about an axis perpendicular to photoresist stripe 34 and parallel to the wafer surface to produce a ridge 11 having smooth sidewalls. Prototypes of laser diode 10 were fabricated while rocking the sample about ±50°. During this fabrication procedure the etching is performed while the wafer is fixed at the ±50° and −50° positions.

Figure 5D:
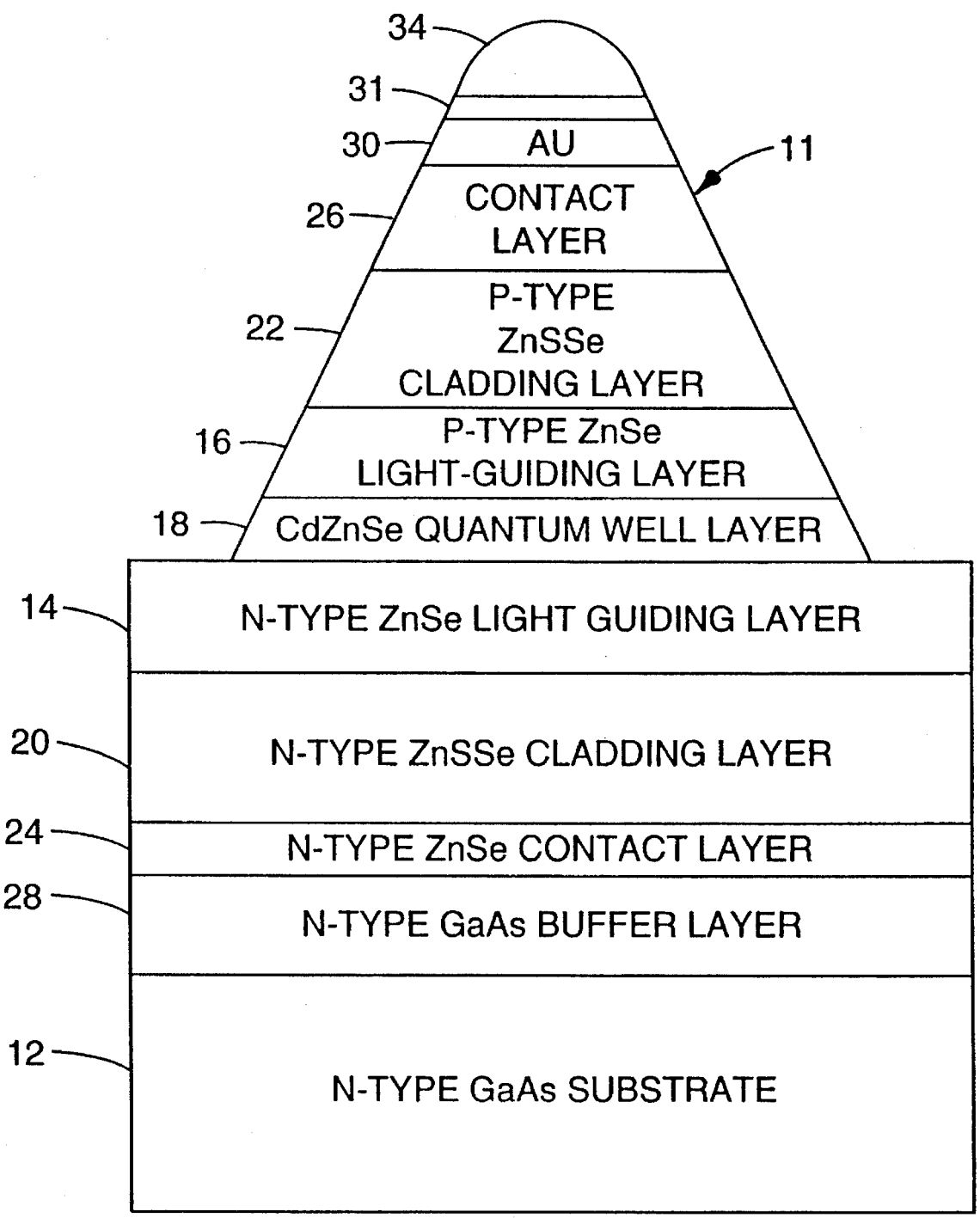

The etch depth is monitored by observing intensity oscillations in the laser beam reflected from the wafer. Reflections from the surface of ZnSe light-guiding layer 16 and GaAs substrate 12 interfere with one another to cause reflectivity oscillations as the thickness of the ZnSe light-guiding layer decreases during the etching operation. Each full oscillation amounts to approximately 0.125 µm of depth. In the embodiment of laser diode 10 shown in FIG. 1, the etching extends to a depth just through quantum well layer 18 to provide good lateral carrier confinement. However, depending on the thicknesses, doping and other characteristics of the layers, and the degree of optical and current confinement required for the intended application of the device, the etch can be made to other depths as well. For example, the etch can be so shallow as to extend only into p-type cladding layer 22, or so deep that it extends through n-type light-guiding layer 14. FIG. 5D is an illustration of the wafer after the etching described above has been completed.

Figure 5E:
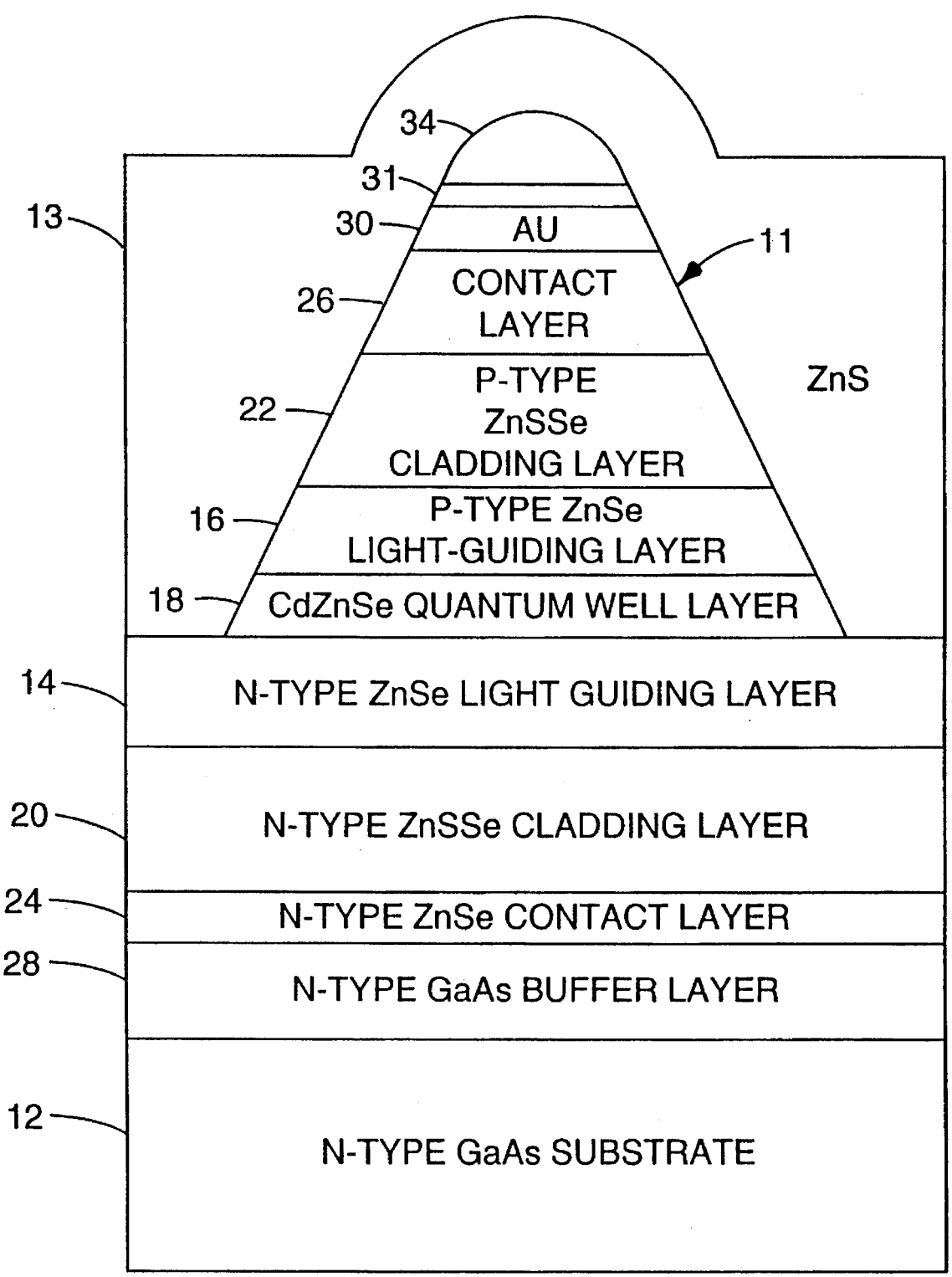

After ridge 11 has been etched, the wafer is immediately removed from vacuum chamber 35 and transferred back to the vacuum evaporator (not shown) in which Au layer 30 was evaporated onto the wafer. The ZnS burying layer 13 is then evaporated onto the wafer. The thickness of the evaporated ZnS burying layer 13 should be great enough to fill in the etched-away material and leave a nearly planar surface. FIG. 5E is an illustration of the wafer after the ZnS burying layer 13 has been evaporated onto the wafer.

Figure 5F:
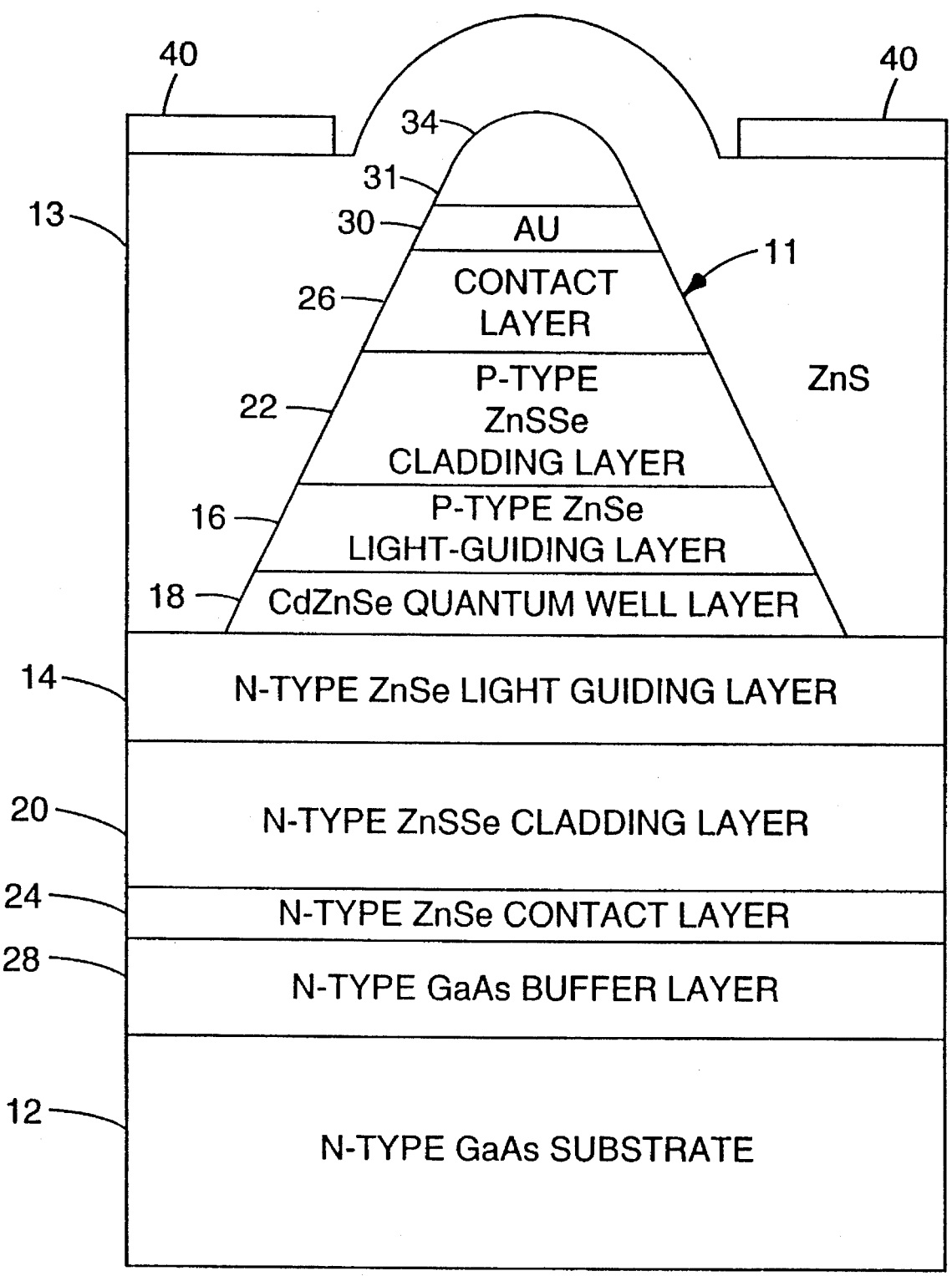

Photoresist masks 40 are subsequently defined on burying layer 13 over portions of the wafer between ridges 11. FIG. 5F illustrates masks 40. In one embodiment, masks 40 are deposited to a thickness of about 1 µm using the Hoechts Celanese process referred to above.

Figure 5G:
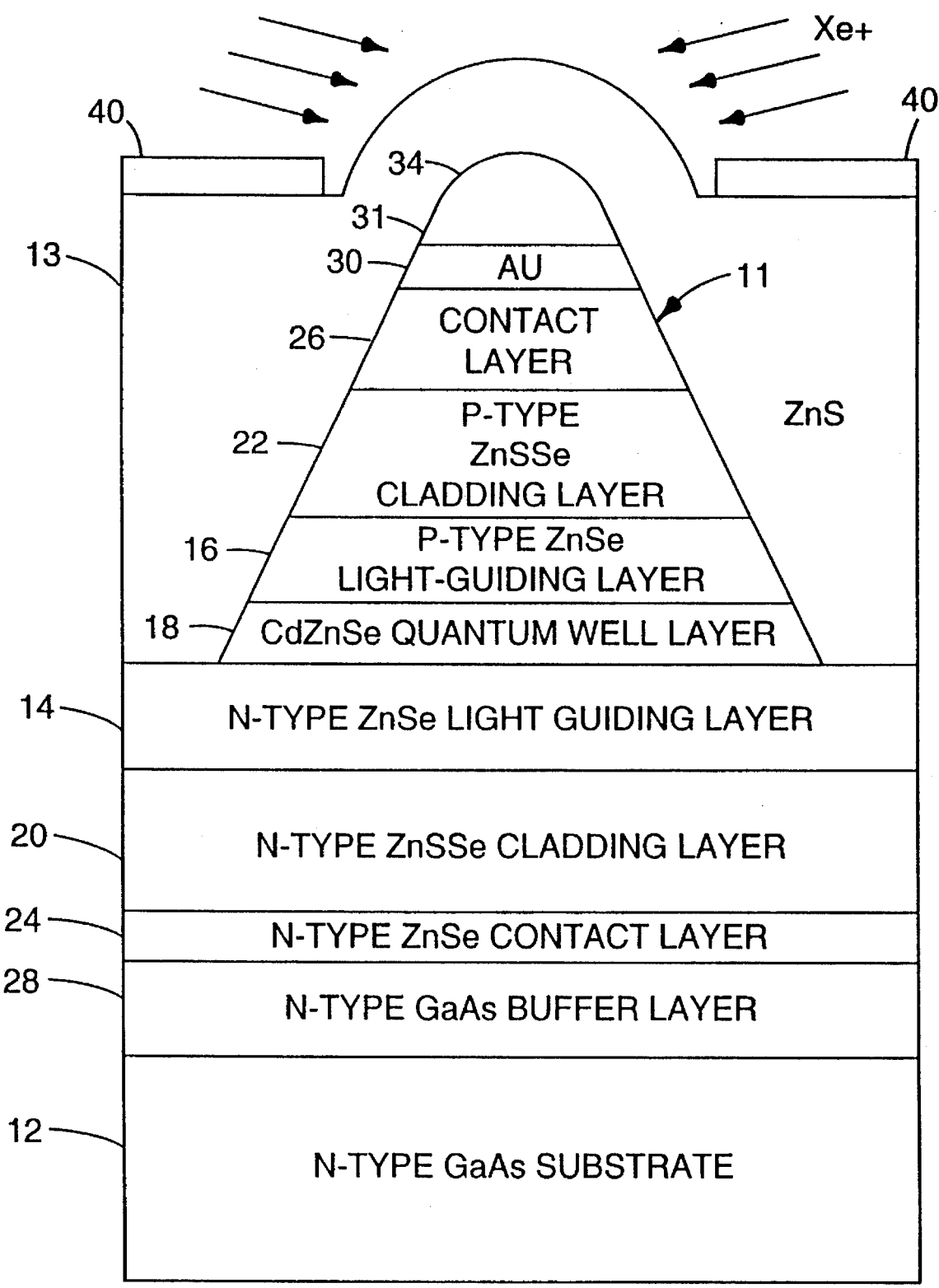
Figure 5H:
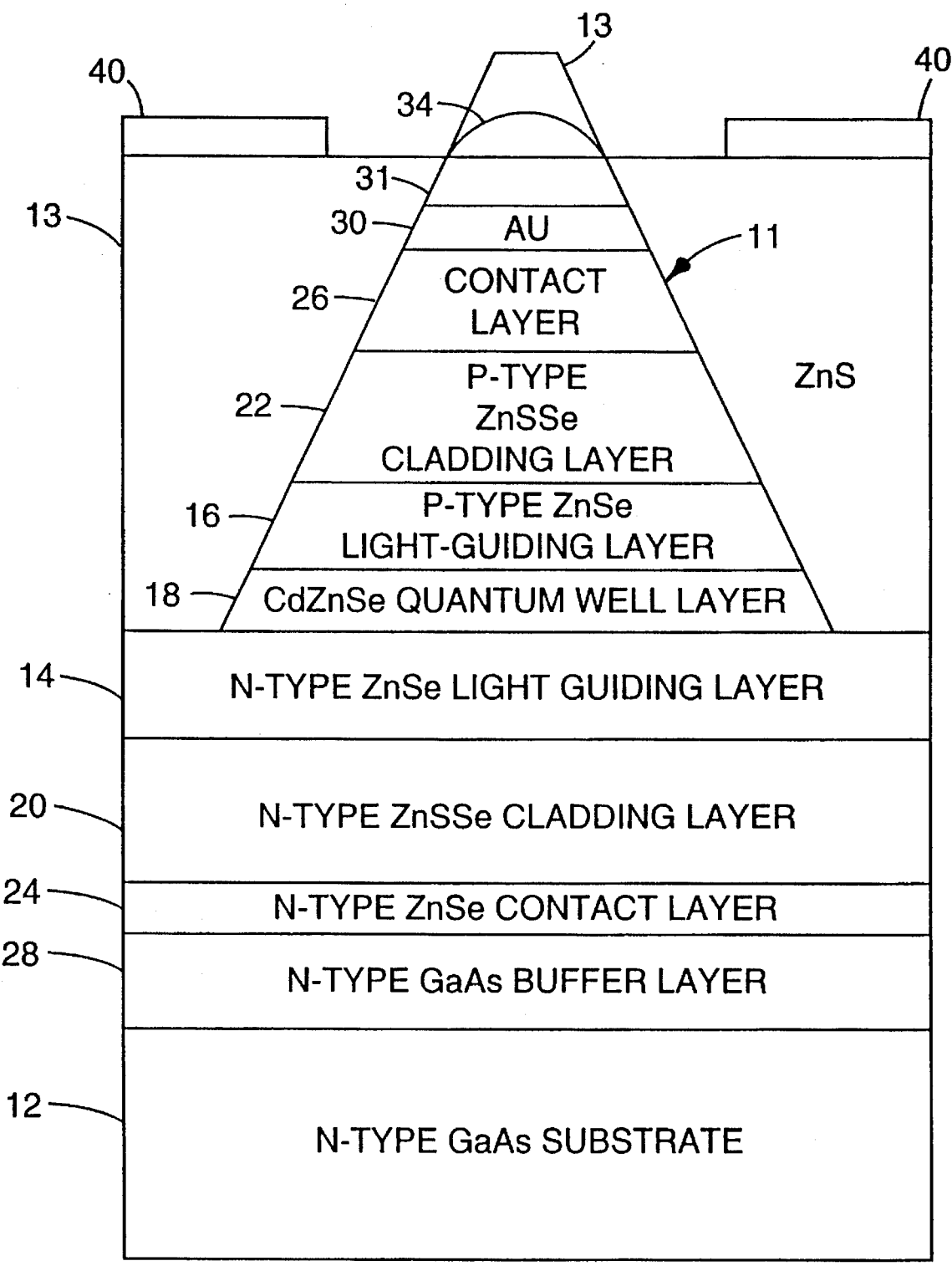
Figure 5I:
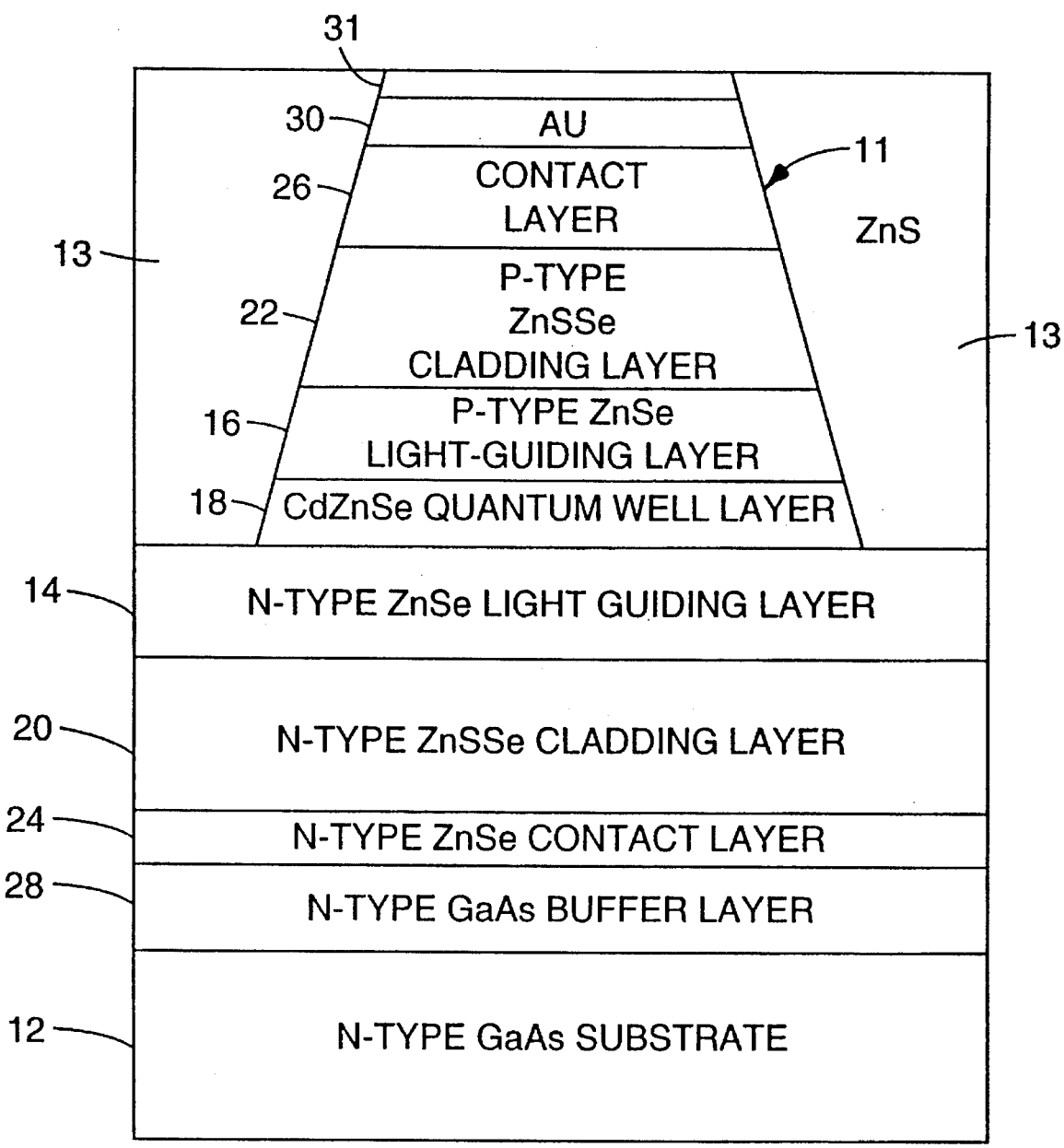

From the vacuum evaporator the wafer is transferred back to vacuum chamber 35 where lift off of the evaporated ZnS above ridge 11 is enabled by another etching operation. As shown in FIG. 5G, the $Xe^+$ or other ion beam is aligned at an angle nearly parallel to the surface of the wafer and perpendicular to ridge 11. In one embodiment the ion etching step is performed with a beam aligned at an angle of about 85° to the normal of the wafer. Each side of ridge 11 is exposed to the ion beam just long enough to etch through the ZnS burying layer 13 that covers the ridge above the photoresist masks 40, as shown in FIG. 5H. Lift off of the remaining photoresist masks 40, stripe 34 and ZnS on the stripe is then performed using conventional acetone and ultrasound techniques. FIG. 5I is an illustration of the wafer after lift off.

Fabrication of the wafer shown in FIG. 1 is completed by transferring the wafer shown in FIG. 5I back to the vacuum chamber (not shown), and forming an upper electrode by evaporating the Ti layer 31 and Au layer 33 over the ridge 11 and burying layer 13. In one embodiment, Ti layer 31 is deposited to a thickness of about 1000 Å, and Au layer 33 deposited to a thickness of about 1000 Å. Layers 31 and 33 can be patterned into stripes (not shown) about 200 µm wide using conventional lift off techniques. A brief (0.3 minute) $O_2$ plasma cleaning step (at about 8 W/cm$^2$, at 200 mTorr) has been found to enhance the adhesion of the Ti and Au layers 31 and 33.

Indium (In) used for MBE substrate bonding can serve as electrode 32 on substrate 12. However, in order to more easily cleave the devices into individual laser diodes 10, it is helpful to thin substrate 12 (e.g., to a thickness of 100–300 µm) by mechanical lapping, thus removing the In. To make a new ohmic contact to substrate 12, the GaAs substrate is etched in a solution of 50 $H_2O$:10 $NH_4OH$: 1 $H_2O_2$ for about 30 seconds (removing approximately 0.2 µm). The etched substrate 12 is then immediately transferred to a vacuum evaporator (not shown) where 500 Å of Pd (Palladium) and then 1000 Å of Au are deposited. Pd alloys with GaAs substrate 12 at very low temperatures, and even slowly at room temperature. Improved electrical characteristics can be achieved by heating at 150° C. in forming gas (5% $H_2$, 95% Ar) for 3 minutes. However, it is important that the wafer not be heated to such a high temperature-as to degrade the layers of II-VI semiconductor, particularly the ZnSe contact layer 26.

Opposite ends of the device were cleaved along (110) planes to form facet mirrors. The facets can also be coated to augment reflectivity. In one embodiment the facets are coated with four alternating quarter wavelength layers of $MgF_2$ and ZnSe to provide about 90% reflectivity. Cavity length of prototype laser diodes 10 is about 1000 µm. Laser diodes 10 are then bonded p-side up to ceramic sample holders with silver-filled epoxy.

Figure 7:
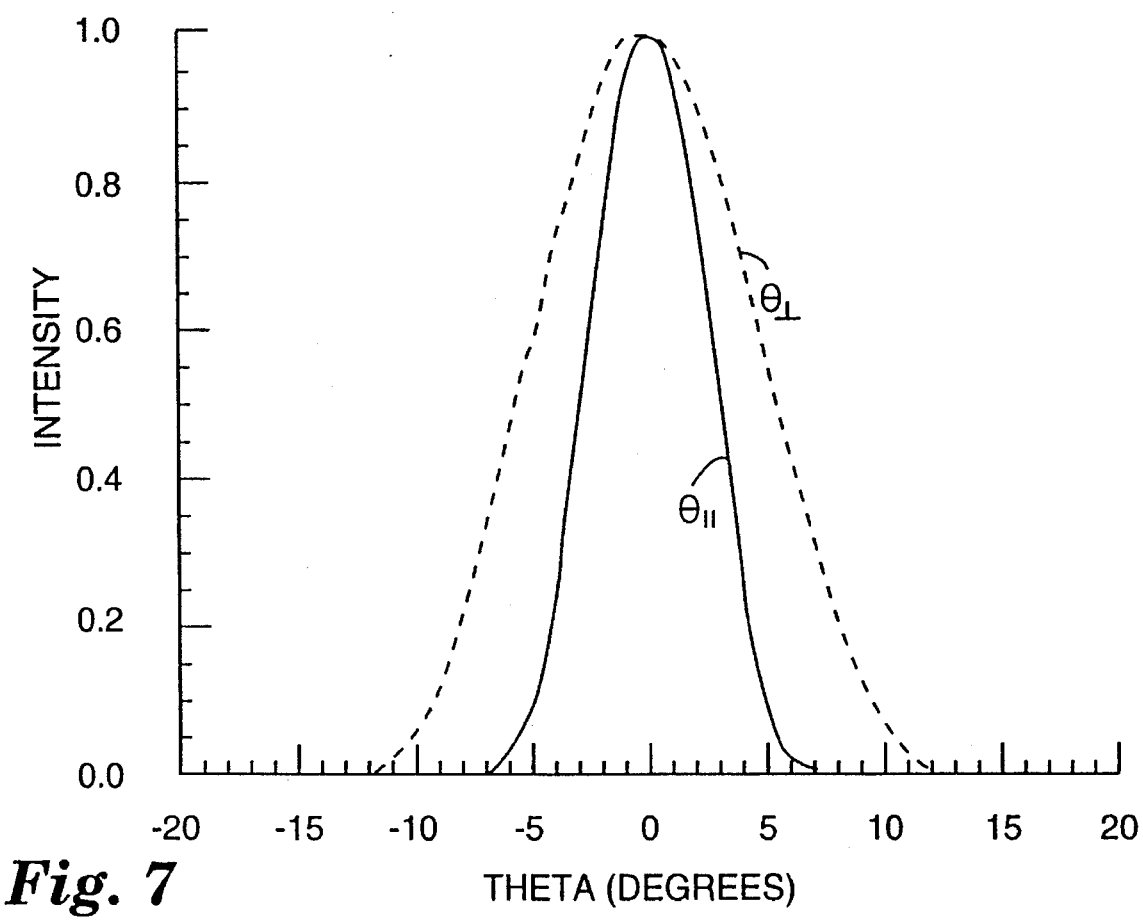
FIG. 7 is a graph of the measured far field beam pattern from a prototype laser diode in accordance with the present invention.

Prototype laser diodes 10 of the type described above have emitted coherent light in the blue-green portion of the spectrum (≈520 nm at room temperature) with threshold currents as low as 4 mA (pulsed) at 85K, and as low as 66 mA at room temperature. The measured far-field pattern for one of these devices is shown in FIG. 7, clearly illustrating the single lateral mode operation of the device. Although not shown, further engineering of the lateral beam profile can be achieved through the use of layers of other materials such as ZnSe, ZnSSe or ZnTe, either in the semiconductor alloy or as separate layers, to tune the effective index of the burying layer 13.

Figure 8:
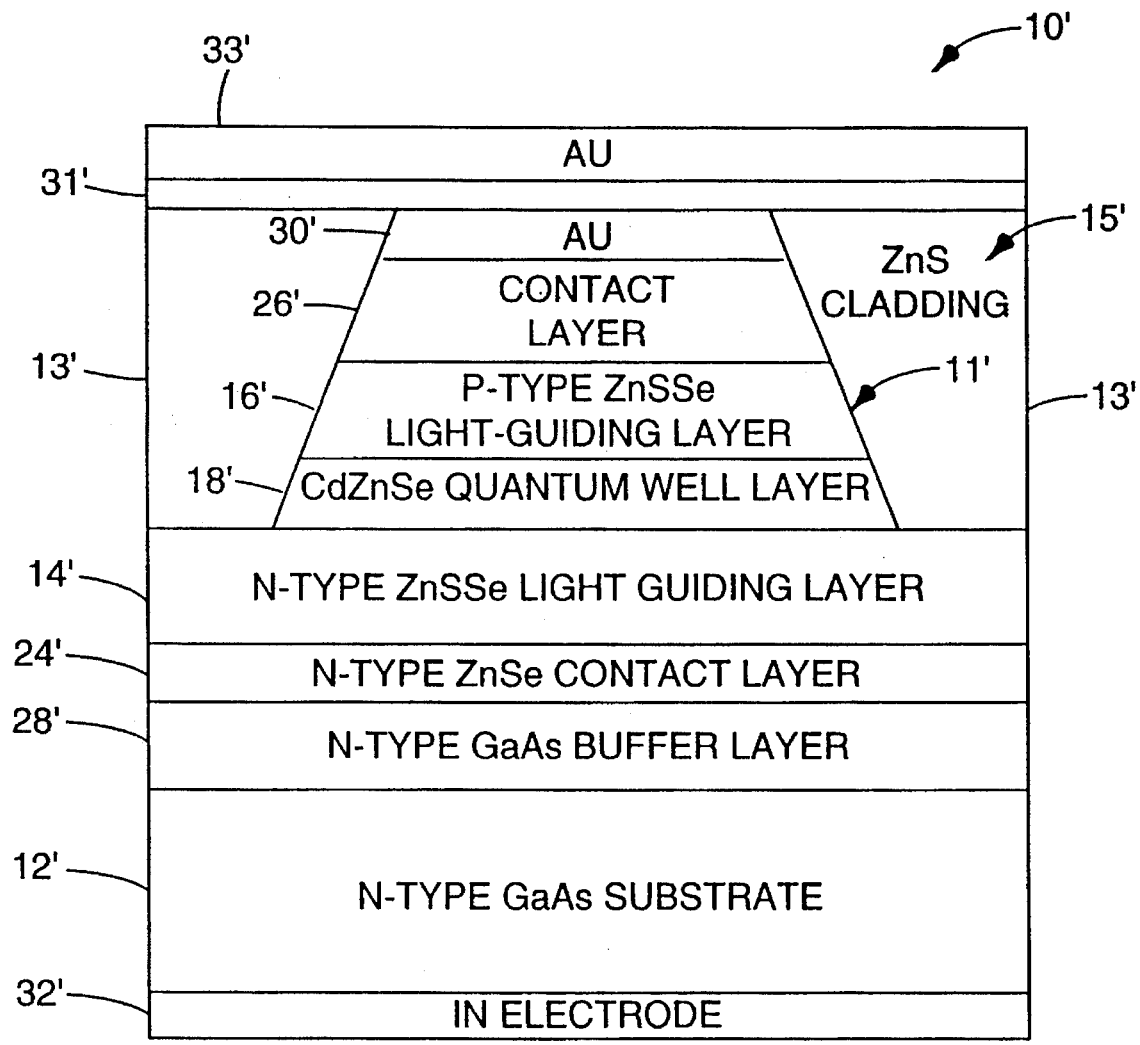
FIG. 8 is a cross-sectional view (not to scale) illustrating the structure of a second embodiment of a II-VI semiconductor laser diode in accordance with the present invention.

Laser diode 10', a second embodiment of the present invention, is illustrated in FIG. 8. Laser diode 10' is structurally similar to laser diode 10, but does not include lower and upper cladding layers (i.e., layers 20 and 22). Laser diode 10' also includes $ZnS_{0.07}Se_{0.93}$ light-guiding layers 14' and 16' (as opposed to the ZnSe guiding layers in laser diode 10). Layers of laser diode 10' which correspond to those of laser diode 10 described above are identified by identical but primed (i.e.,"x") reference numerals. Other than the differences described below, the layers of laser diode 10' and buried-ridge waveguide 15' can be fabricated in a manner similar to their counterparts in laser diode 10 and described above.

Light-guiding layer 14' and contact layer 24' are both doped n-type with Cl in prototypes of laser diode 10'. Light-guiding layer 16' and ohmic contact layer 26' are doped p-type with N in these prototypes. The net donor concentration to which the lower light-guiding layer 14' is doped is $1 \times 10^{17} cm^{-3}$, while the upper light-guiding layer 16' is doped to a net acceptor concentration of $2 \times 10^{17} cm^{-3}$. Ohmic contact layers 24' and 26' are both deposited to a thickness of 0.1 µm in the prototype devices. The lower contact layer 24' is doped n-type to a net donor concentration of $7 \times 10^{18} cm^{-3}$. The upper contact layer 26' is doped p-type to a net acceptor concentration of $2 \times 10^{18} cm^{-3}$.

Light generated in quantum well active layer 18' is guided within light-guiding layers 14' and 16', clad only by the GaAs substrate 12' and the Au layers 30' and 33'. Good optical confinement and sufficiently low loss are obtained in laser diode 10' without the need for II-VI semiconductor cladding layers. Computer modeling is used to select appropriate thicknesses for light-guiding layers 14' and 16'. This modeling approach takes into account the buried-ridge waveguide 15' and the complex indices of refraction of GaAs substrate 12' and Au electrode layer 30' Modeling methods of this type are generally known and disclosed, for example, in M. R. Ramdas et al., *Analysis of Absorbing and Leaky Planar Waveguides: A Novel Method,* Optics Letters, Vol. 14, p. 376 (1989) and the references cited therein.

Figure 9:
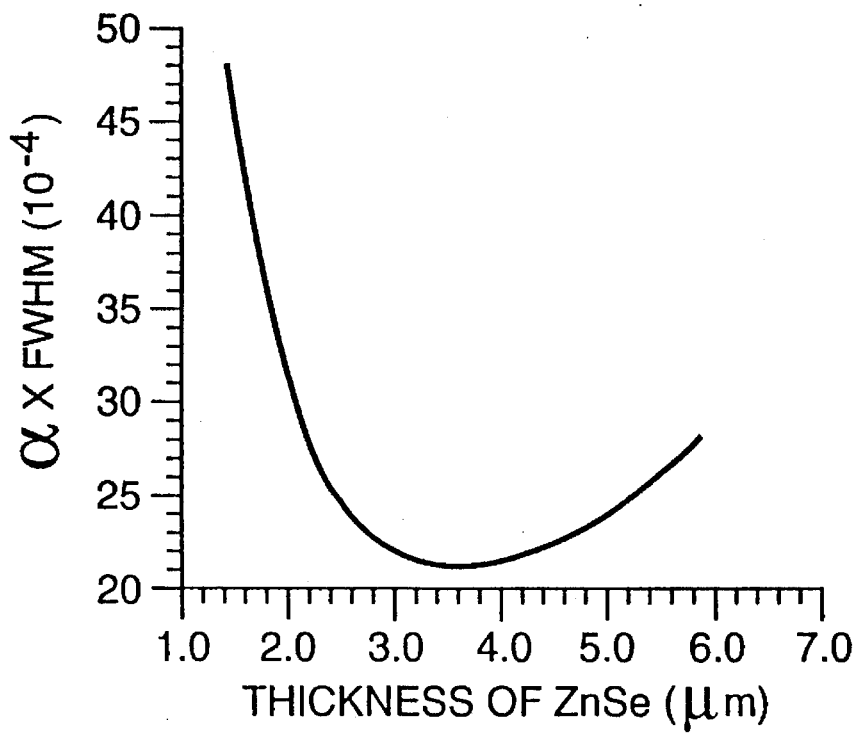
FIG. 9 is a graph illustrating the product of the loss coefficient ($\propto$) and the full width at half maximum (FWHM) intensity of the optical mode as a function of the thickness of the light-guiding layers, for the laser diode shown in FIG. 8.

FIG. 9 is a graph illustrating the product of the loss coefficient (∝) and the full width at half maximum intensity (FWHM) of the desired optical mode (TE polarized for the prototypes of laser diode 10' described herein) as a function of the thickness of the ZnSSe layers 14' and 16' (FIG. 8). To minimize the threshold current density of the device, this product should be minimized. Using this design criterion and the information shown in FIG. 9, the thickness of the waveguide (i.e., the combined thicknesses of light-guiding layers 14' and 16') is approximately 3.5 µm in the prototype laser diode 10'. In this embodiment, n-type light-guiding layer 14' has a thickness of 2.0 µm, while p-type light-guiding layer 16' has a thickness of 1.5 µm. The loss due to free-carrier absorption and scattering is estimated to be 8 cm$^{-1}$ in this embodiment. Quantum well layer 18' has only a relatively small effect on the loss and optical confinement characteristics of the device, and its presence is neglected during the design procedure described above. Theory suggests that total waveguide thicknesses less than 2.0 µm result in excessive absorption losses in substrate 12' and Au electrode layer 30'. At a thickness of 2.5 µm, the substrate and electrode absorption losses are 11.7 cm$^{-1}$. On the other hand, thicknesses greater than about 6 µm the optical confinement is so poor that the single quantum well layer 18' cannot practically supply enough gain to overcome the losses. The FWHM of the optical mode is found to be almost exactly half of the waveguide thickness. The maximum modal gain is inversely proportional to the FWHM of the waveguide mode. For a waveguide that is 6 µm thick, the FWHM is about 3 µm, and the modal gain from a single quantum well can be estimated to be 12 cm$^{-1}$. See e.g., N. K. Dutta, *Applied Physics Letters*, vol. 53, p. 72 (Nov. 1982). The process for forming a buried ridge in this embodiment is similar to that described above for a laser diode with II-VI cladding layers.

Similarly, a buried-ridge can be fabricated with these techniques in other types of II-VI semiconductor laser diode designs. For example, a simple double-heterostructure II-VI laser diode fabricated from MgZnSSe-ZnSSe or MnZnSSE-ZnSSe can in this way be fabricated into a buried ridge laser diode. Such devices would exhibit substantially lower threshold current and improvement in optical beam quality, when compared to gain-guided devices.

Figure 10:
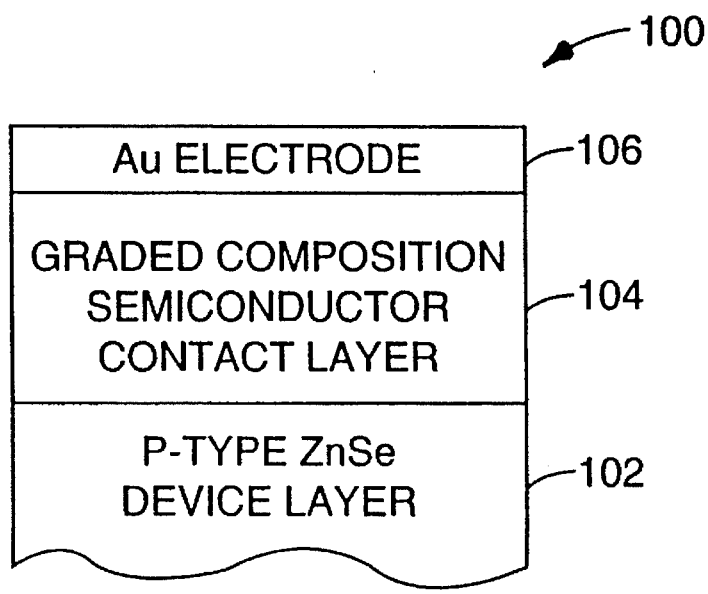
FIG. 10 is an illustration of an alternative p-type ohmic contact for the laser diodes shown in FIGS. 1 and 8.

FIG. 10 is an illustration of a graded ohmic contact 100 to a p-type ZnSe device layer 102. As shown, ohmic contact 100 includes a graded composition semiconductor compound contact layer 104 over device layer 102, and an Au or other metallic layer 106 over the contact layer. Although described in conjunction with a ZnSe device layer 102 in the embodiment shown in FIG. 10, ohmic contact layer 100 can be configured for use with other p-type II-VI semiconductor compound device layers such as ZnS, ZnSSe, CdZnS, CdMgZnS, CdMnZnS, MgZnSSe and MnZnSSe, and substituted for ohmic contact layers 26 and 26' in laser diodes 10 and 10', respectively. Ohmic contact 100 can also be incorporated into II-VI light emitting diodes.

Ohmic contact layer 104 is a graded composition semiconductor compound which includes ZnTe. The average (i.e., when averaged over the thickness of the contact layer) relative amount of ZnTe in the semiconductor compound, with respect to other elements or compounds in the contact layer 104, increases with increasing distance of the contact layer from device layer 102. In addition to containing ZnTe, the semiconductor compound of contact layer 104 can include a semiconductor compound lattice matched to the substrate (not shown) on which the device is fabricated. The semiconductor compound of contact layer 104 can also include the semiconductor compound of the device layer, or a semiconductor alloy including ZnTe.

Figure 11:
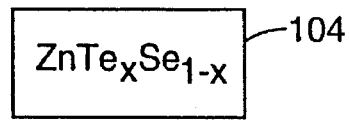
FIG. 11 is an illustration of a first embodiment of the graded ohmic contact layer shown in FIG. 10.

In the embodiment shown in FIG. 11, contact layer 104 is a graded composition ZnSe$_{1-x}$Te$_x$ layer (i.e., an alloy of ZnSe and ZnTe), where x≦1. The grading is performed by increasing the value of x with increasing thickness of the contact layer 104 as the contact layer is being grown. Adjustable parameters include the final composition of the ZnSeTe, the grading rate and the doping density. In one embodiment, the contact layer was doped with N to a net acceptor density of 4×10$^{18}$cm$^{-3}$ near the surface. This contact layer 104 was grown to a thickness of about 2 µm by molecular beam epitaxy in a chamber of the type illustrated generally in FIG. 2, while uniformly increasing x from about 0 to about 0.1 with increasing distance from the device layer. The grading rate is controlled by controlling the temperatures of the Se and Te effusion cells during the epitaxial growth.

Increases in the net acceptor concentration reduce the width of the barrier to hole injection from the Au electrode 106 (FIG. 10) into the ZnSeTe contact layer 104. By grading the composition of this ternary semiconductor compound in this manner, the discontinuity in the valence band is avoided. Grading also results in a gradual, rather than abrupt, change in the lattice parameter, and thus spatially spreads out the dislocations due to lattice mismatch. Prototype ohmic contacts of the type described in this and the immediately preceding paragraphs and grown at low temperatures have exhibited relatively low resistance, and maximum continuous current densities of up to 1250 A/cm$^2$.

Figure 12:
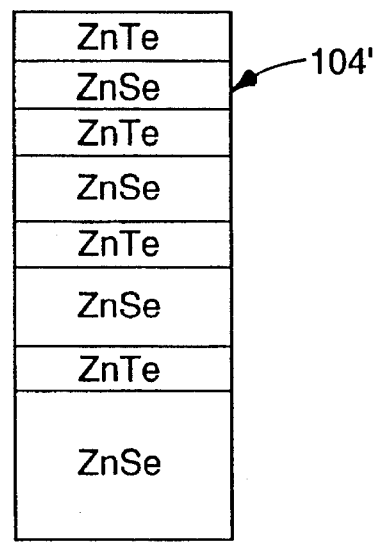
FIG. 12 is an illustration of a second embodiment of the graded ohmic contact layer shown in FIG. 11.

Ohmic contact layer 104', a second embodiment of the ohmic contact layer shown generally in FIG. 10, is illustrated in FIG. 12. As shown, ohmic contact layer 104' includes layers of p-type ZnTe (i.e., a first semiconductor compound including Zn and Te) spaced between layers of p-type ZnSe (i.e., a second semiconductor compound including the semiconductor compound of device layer 102 (FIG. 10). The composition of ohmic contact layer 104' is effectively graded by increasing the density of the ZnTe layers with increasing distance from the ZnSe device layer (not shown in FIG. 12). In other words, the spatial frequency at which layers of ZnTe are spaced between layers of ZnSe increases with increasing distance of the contact' layer from the device layer. In other embodiments (not shown), the semiconductor compound of ohmic contact layers such as 104' having spaced layers of ZnTe and ZnSe is graded by increasing the average thickness of the layers of ZnTe as their distance from the device layer increases, and/or by doping to increase the net acceptor concentrations of the ZnTe layers as their distance from the device layer increases. Other variables which can be adjusted during the growth of contact layer 104' to grade the layer include the number of ZnTe layers, the amount of coverage by the ZnTe in each layer, the spacing between the ZnTe layers, and the doping format and density. The ZnTe layers can be complete or fractional monolayers, and are grown by alternating beam epitaxy approaches such as atomic layer epitaxy (ALE) or MEE. Alternating beam epitaxial growth facilitates better control over the grading rate and thickness of contact layer 104' than does the continuously graded contact layer 104 described above.

Figure 13:
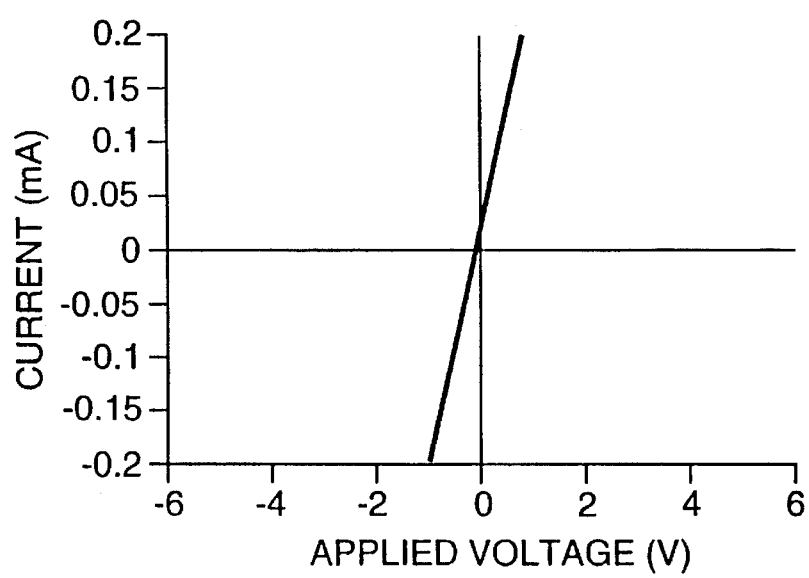
FIG. 13 is a graph of the I-V characteristics of a prototype ohmic contact of the type illustrated generally in FIG. 10.

One prototype of ohmic contact layer 104' (not shown) includes fifteen sheets or layers of ZnTe and three layers delta-doped with N. The first twelve layers of ZnTe are separated from each other by two monolayers of ZnSe, while the upper three layers of ZnTe were separated by one monolayer of ZnSe. Each layer of ZnTe is expected to be approximately 0.5 monolayers in average thickness. The first, seventh and uppermost layer of ZnTe were doped with N. This prototype exhibited a maximum continuous current density of about 1250 A/cm$^2$. The measured I-V (current-voltage) characteristic of this prototype ohmic contact layer 104' are illustrated in FIG. 13. The additional charge resulting from the increased net acceptor density in the ZnTe layers reduces the width of the barrier to hole injection.

States originating from the ZnTe valence band provide additional channels for tunneling which also increases the tunneling current. In addition, the work function of the p-type ZnSeTe decreases with increasing ZnTe concentration, thereby lowering the Schottky barrier height.

In other embodiments (not shown) the graded ohmic contact is configured for use in conjunction with a p-type ZnS device layer and includes graded ZnSTe. Similarly, a graded ohmic contact to a ZnSSe (or ZnSe) device layer can be achieved by grading from ZnSSe. (or ZnSe) to ZnSTe. This embodiment offers the advantage that all or part of the p-type contact layer can be made lattice-matched to the device layer by choosing the correct composition of ZnSTe. Yet another embodiment (also not shown) is a graded ohmic contact to a p-type MgZnSSe device layer. In this embodiment, the ohmic contact layer can be graded first to ZnSSe, and then to ZnSeTe or ZnSTe.

Laser diodes in accordance with the present invention offer considerable advantages over those of the prior art. By relying on polycrystalline II-VI materials deposited by vacuum evaporation from compound sources for the burying layer, the wafer need not be intentionally heated above room temperature. This fabrication process eliminates the need for high temperatures that can affect the conductivity of the p-type layers. The evaporated, polycrystalline II-VI burying layer is also of excellent optical quality, thereby facilitating low-loss waveguides. Furthermore, the polycrystalline burying layer exhibits very high electrical resistivity so there is little leakage current. Virtually all the applied current therefore flows through the ridge. Prototypes have exhibited single-lateral-mode operation in the blue-green portion of the spectrum with relatively low threshold currents. The graded composition ohmic contact offers relatively high current carrying capabilities at relatively low resistances compared with prior art ohmic contacts to p-type II-VI semiconductors. Laser diodes with this ohmic contact can therefore be operated at lower voltages, thereby reducing the heat dissipated by the device and increasing device reliability. The laser diodes are also relatively simple in construction and efficiently fabricated.

Although the present invention has been described with reference to preferred embodiments, those skilled in the art will recognize that changes may be made in form and detail without departing from the spirit and scope of the invention. In particular, semiconductors and compounds which are otherwise II-VI materials, but which include Mn or other elements not in Groups II or VI on the Periodic Table (e.g., the dilute magnetic semiconductors), yet effectively function as II-VI semiconductors (e.g., MnZnSSe), are II-VI semiconductors for purposes of this invention.

What is claimed is:

1. A method for fabricating a II-VI compound semiconductor laser diode with a self-aligned buried-ridge waveguide, including:

providing a semiconductor substrate of a first conductivity type;

growing epitaxial layers of II-VI semiconductor above one another on the substrate, including:

growing a first guiding layer of the first conductivity type;

growing a second guiding layer of a second conductivity type over the first guiding layer to form a pn junction with the first guiding layer; and growing a quantum well active layer adjacent the pn junction;

etching portions of at least one of the layers of semiconductor to form a ridge;

forming a II-VI semiconductor burying layer to bury the ridge;

etching the burying layer to expose an upper surface of the ridge; and depositing electrodes on opposite sides of the ridge to couple electrical energy to the pn junction.

2. The laser diode fabrication method of claim 1 wherein forming the burying layer includes depositing a polycrystalline II-VI semiconductor burying layer over the ridge.

3. The laser diode fabrication method of claim 2 wherein forming the burying layer includes depositing the polycrystalline II-VI semiconductor burying layer by vacuum evaporation.

4. The laser diode fabrication method of claim 1 wherein etching the layers to form the ridge includes ion etching with $Xe^+$.

5. The laser diode fabrication method of claim 1 wherein etching to expose the upper surface of the ridge includes:

applying a photoresist mask above the burying layer over portions of the burying layer adjacent the ridge; and ion beam etching to remove portions of the burying layer over the ridge.

6. The laser diode fabrication method of claim 5 wherein ion beam etching to remove portions of the burying layer includes directing the ion beam toward the laser diode at an angle between about 45° and 90° with respect to normal.

7. The laser diode fabrication method of claim 5 wherein the ion beam etching to remove portions of the burying layer includes directing the ion beam toward the laser diode at an angle between about 80° and 90° with respect to normal.

8. The laser diode fabrication method of claim 5 and further including lifting off any remaining burying layer semiconductor and photoresist on the ridge following ion beam etching to remove portions of the burying layer.

9. The laser diode fabrication method of claim 1 wherein etching portions of the semiconductor layers includes etching through at least portions of the second guiding layer.

10. The laser diode fabrication method of claim 1 wherein:

growing epitaxial layers of II-VI semiconductor further includes:

growing a first cladding layer of the first conductivity type between the substrate and the first guiding layer; and growing a second cladding layer of the second conductivity type opposite the second guiding layer from the first guiding layer.

11. The laser diode fabrication method of claim 10 wherein etching portions of the semiconductor layers includes etching through portions of the second cladding layer.

12. The laser diode fabrication method of claim 10 wherein etching portions of the semiconductor layers includes etching portions of the second cladding layer and the second guiding layer.

13. The laser diode fabrication method of claim 10 wherein etching portions of the semiconductor layers includes etching through portions of the second cladding layer and the second guiding layer.

* * * * *